United States Patent
Miyazawa

(10) Patent No.: US 7,214,615 B2
(45) Date of Patent: May 8, 2007

(54) METHOD OF MANUFACTURING SEMICONDUCTOR DEVICE, SEMICONDUCTOR DEVICE, CIRCUIT SUBSTRATE AND ELECTRONIC APPARATUS

(75) Inventor: Ikuya Miyazawa, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/801,952

(22) Filed: Mar. 16, 2004

(65) Prior Publication Data

US 2004/0238927 A1    Dec. 2, 2004

(30) Foreign Application Priority Data

Mar. 17, 2003  (JP)  ............................. 2003-072337
Mar. 19, 2003  (JP)  ............................. 2003-076111

(51) Int. Cl.
   *H01L 21/44* (2006.01)
(52) U.S. Cl. ................ 438/667; 438/675; 257/E21.061
(58) Field of Classification Search ............... 438/597, 438/612, 620, 652, 653, 674, 666, 667, 675
   See application file for complete search history.

(56) References Cited

U.S. PATENT DOCUMENTS

| | | | |
|---|---|---|---|
| 5,231,751 A | | 8/1993 | Sachdev et al. |
| 5,618,752 A | | 4/1997 | Gaul |
| 5,793,105 A | * | 8/1998 | Pace ........................... 257/700 |
| 6,087,719 A | | 7/2000 | Tsunashima |
| 6,383,837 B1 | | 5/2002 | Tsunashima |
| 6,429,096 B1 | | 8/2002 | Yanagida |
| 6,809,421 B1 | * | 10/2004 | Hayasaka et al. ............ 257/777 |
| 6,916,725 B2 | * | 7/2005 | Yamaguchi ................. 438/459 |
| 7,029,937 B2 | * | 4/2006 | Miyazawa .................... 438/40 |

FOREIGN PATENT DOCUMENTS

| | | |
|---|---|---|
| JP | 2988045 | 3/1993 |
| JP | 11-345933 | 12/1999 |
| JP | 2000-510288 | 8/2000 |
| JP | 2000-294522 | 10/2000 |
| JP | 2001-53218 | 2/2001 |
| JP | 2002-025948 | 1/2002 |

(Continued)

OTHER PUBLICATIONS

Patent Abstracts of Japan, 2002-025948 (2 pages).

(Continued)

*Primary Examiner*—Scott B. Geyer
(74) *Attorney, Agent, or Firm*—Harness, Dickey & Pierce, P.L.C.

(57) ABSTRACT

A method of manufacturing a semiconductor device having electrodes penetrating a semiconductor substrate, the method includes the steps of forming a concave portion extending from an active surface of a semiconductor substrate on which an integrated circuit is formed to an interior of the semiconductor substrate, forming a first insulating layer on an inner surface of the concave portion, filling an inner side of the first insulating layer with an electroconductive material so as to form an electrode, exposing a distal end portion of the first insulating layer by etching a rear surface of the semiconductor substrate, forming a second insulating layer on a rear surface of the substrate, and exposing the distal end portion of the electrode by removing the first insulating layer and the second insulating layer from a distal end portion of the electrode.

9 Claims, 19 Drawing Sheets

FOREIGN PATENT DOCUMENTS

| | | |
|---|---|---|
| JP | 2002-25948 | 1/2002 |
| KR | 2001-0006877 | 1/2001 |
| WO | 98/19337 | 5/1998 |
| WO | WO 03/079431 | 3/2003 |
| WO | WO 98/19337 | 3/2003 |

OTHER PUBLICATIONS

Patent Abstracts of Japan, 2000-294522 (1 page).
Patent Abstracts of Japan, 2001-053218 (1 page).
Patent Abstracts of Japan, 11-345933 (2 pages).
Patent Abstracts of Japan, 05-075014 (2 pages).
Integrated Circuits and Method for Their Fabrication, WO9819337 (1 page).
Office Action issued in counterpart Chinese Patent Application.
Communication from German Patent Office re: related application.
Communication from Korean Patent Office re: related application, no translation.

* cited by examiner

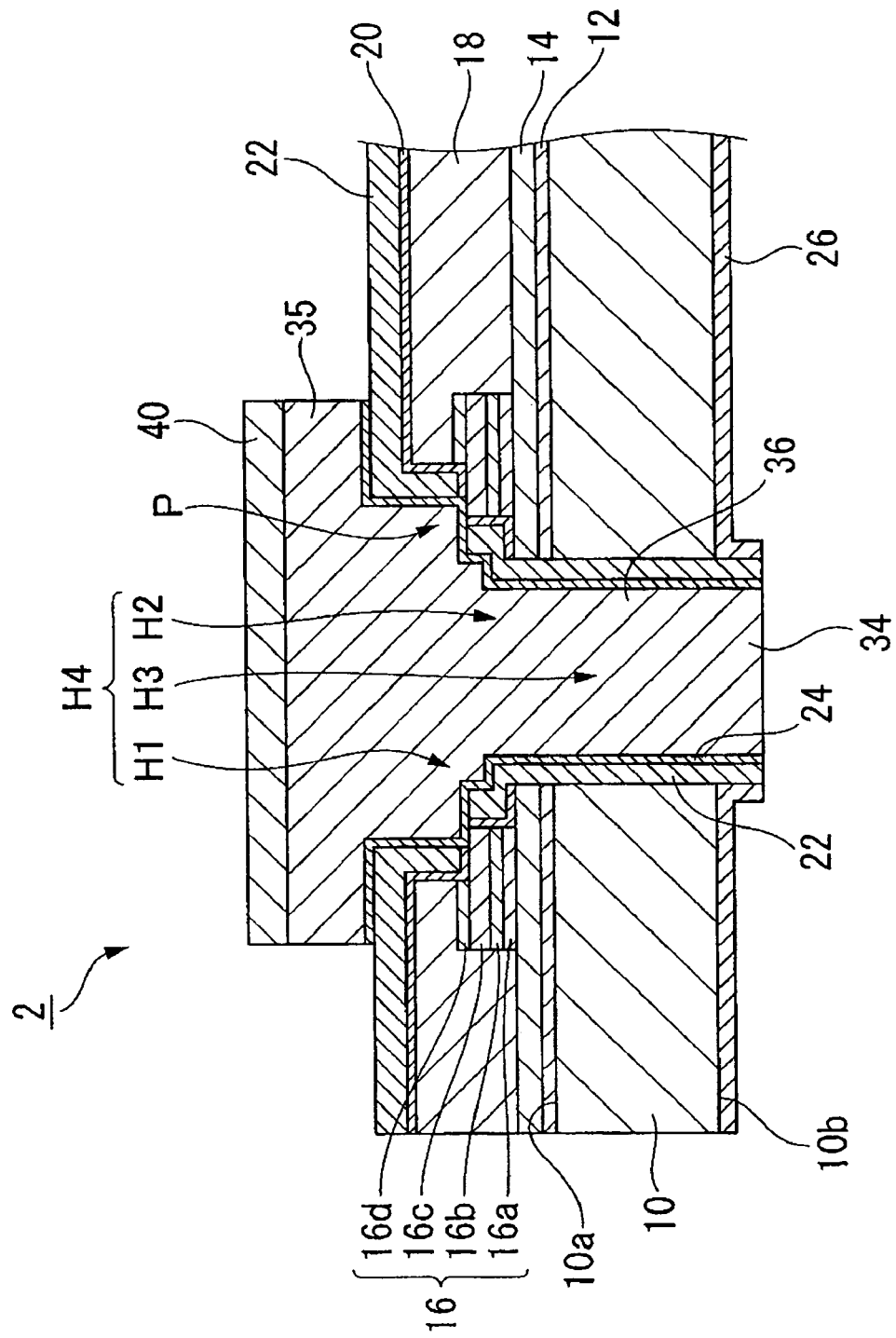

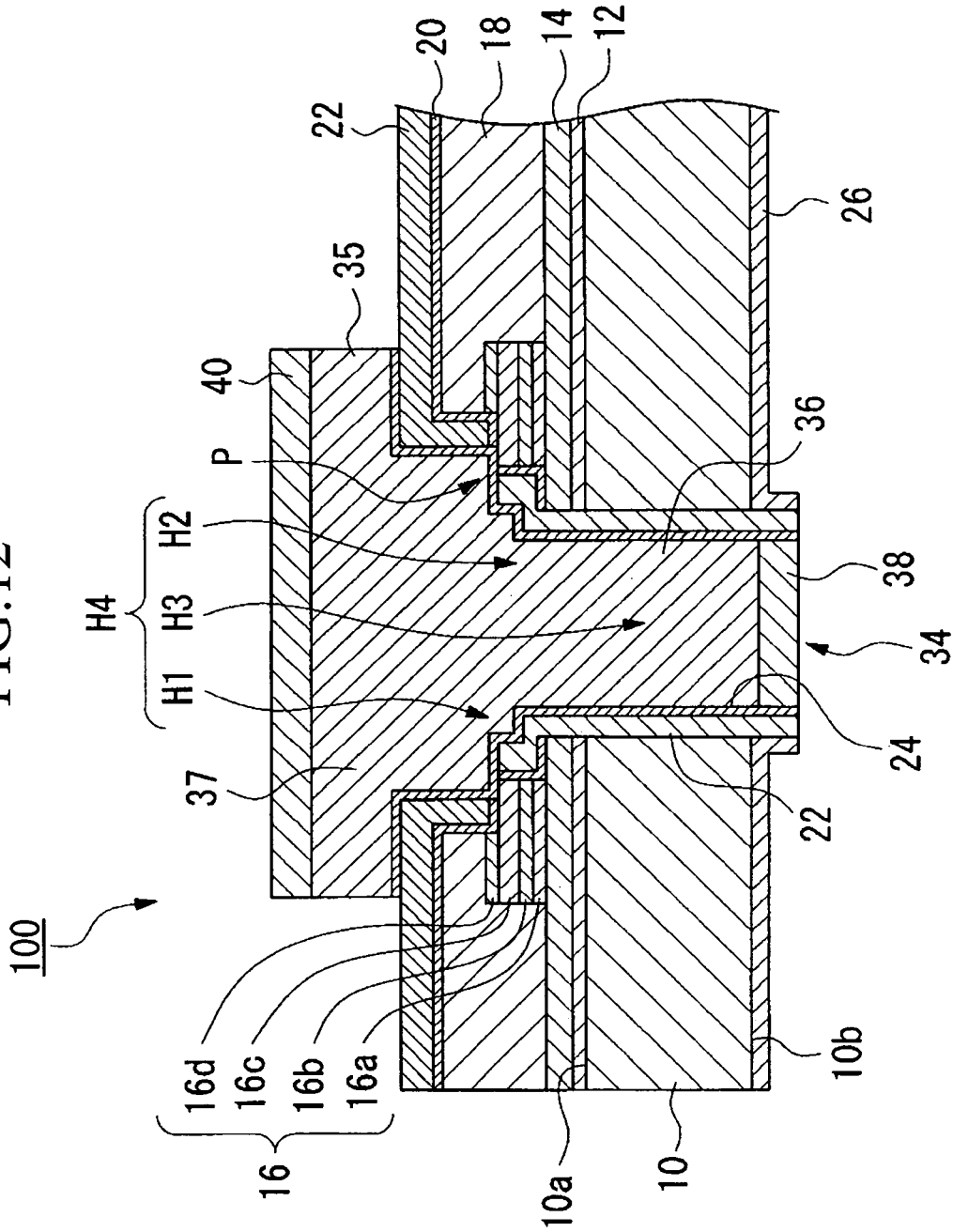

FIG.19
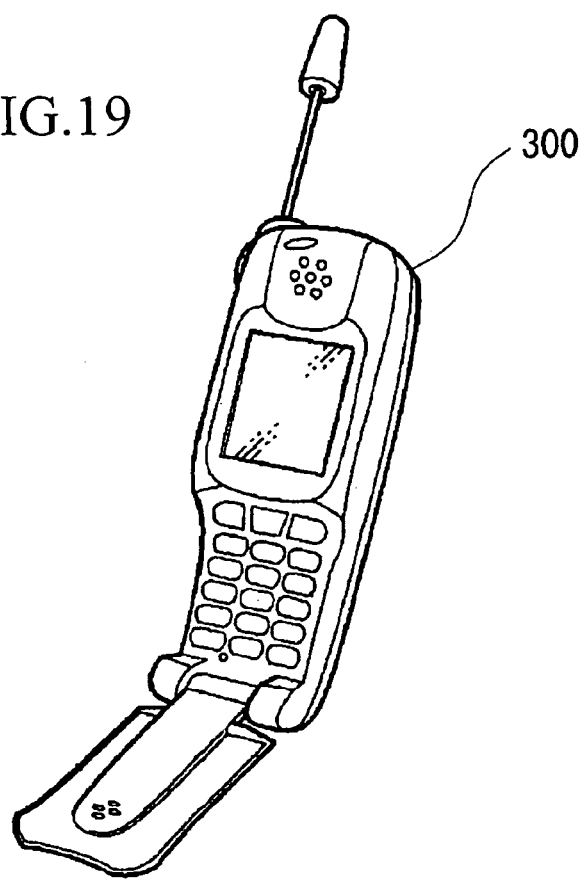
FIG.20 "Prior Art"
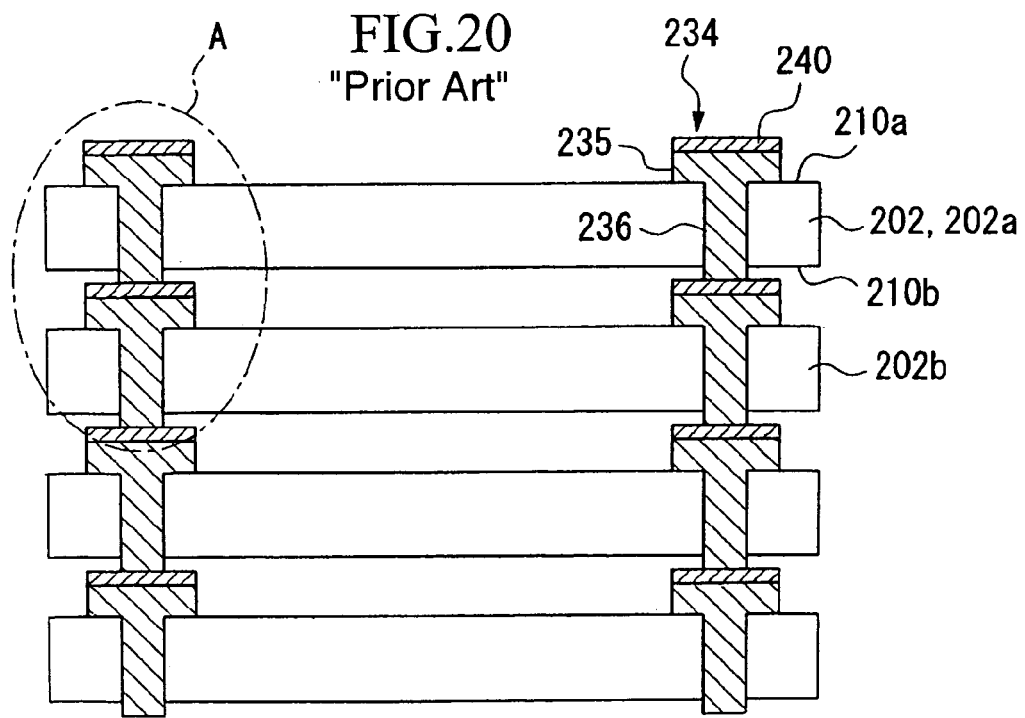

METHOD OF MANUFACTURING SEMICONDUCTOR DEVICE, SEMICONDUCTOR DEVICE, CIRCUIT SUBSTRATE AND ELECTRONIC APPARATUS

BACKGROUND OF THE INVENTION

1. Field of the Invention

The present invention relates to a method of manufacturing a semiconductor, a semiconductor, a circuit substrate and an electronic apparatus and, in particular, to a semiconductor chip suitable for three-dimensional packaging and to a method of manufacturing the same.

Priority is claimed on Japanese Patent Applications No. 2003-72337, filed Mar. 17, 2003, and No. 2003-76111, filed Mar. 19, 2003, the content of which is incorporated herein by reference.

2. Description of Related Art

Reductions in size and weight are demanded in portable electronic apparatuses such as mobile telephones, notebook computers, and personal digital assistance (PDA).

Accompanying this, packaging space for semiconductor chips in the aforementioned electronic apparatuses is extremely restricted, and high density semiconductor chip packaging is a problem. Therefore, three-dimensional packaging technology such as that shown in, for example, in Japanese Unexamined Patent Application, First Publication No. 2002-25948 has been devised. Three-dimensional packaging technology is a technology that achieves high density packaging of semiconductor chips by stacking semiconductor chips together, and connecting each semiconductor chip by wiring.

Here, FIG. 20 is a side cross-sectional view of stacked semiconductor chips, FIG. 21 is an enlarged view of the portion A in FIG. 20.

As shown in FIG. 20, a plurality of electrodes 234 are formed in each semiconductor chip 202 used in three-dimensional packaging technology. The electrodes 234 are formed so as to penetrate the semiconductor chip 202 from an electrode pad (not shown) formed in an active surface 210a of the semiconductor chip 202 to a rear surface 210b of the semiconductor chip 202. The portion of the electrode 234 that fills the through hole in the semiconductor chip 202 is called a plug portion, while the portion that protrudes at a front surface of the semiconductor chip 202 is called a post portion. Note that, in order to prevent short-circuits between signal wires and an earth, as shown in FIG. 21, an insulating film 222 is formed at an inner surface of the through hole 232 in the semiconductor chip.

As shown in FIG. 21, a solder layer 240 is formed at a top end surface of the post portion 235 of the electrode 234. The semiconductor chips 202a and 202b are stacked in a position such that the bottom surface of the plug portion 236 of the electrode 234 of the upper semiconductor chip 202a is placed on a top surface of the post portion 235 of the electrode 234 of the lower semiconductor chip 202b. Here, the semiconductor chips 202a and 202b are mutually compressed while the solder layer 240 is melted by reflow. As a result, a solder alloy is formed in the portion of contact between the solder layer 240 and the electrode 234, so that the two are mechanically and electrically bonded. The semiconductor chips 202a and 202b are thus connected by wiring.

However, there is a concern that the solder layer 240 that is melted by reflow will be deformed upwards along the outer circumference of the plug portion 36 of the electrode 234 of the upper semiconductor chip 202a, and will make contact with the rear surface 210b of the upper semiconductor chip 202a. This would cause the problem of short-circuiting occurring between the signal wiring and the ground as the signal wiring is connected to the solder layer 240 while the ground is connected to the rear surface 210b of the semiconductor chip 202a.

Moreover, the bottom surface of the plug portion 236 of the electrode 234 is exposed to the air in the semiconductor chip 202a before it is stacked. Therefore, if there is a lengthy time between the formation and the stacking of the semiconductor chip 202a, it is possible that the bottom surface of the plug portion 236 of the electrode 234 will become oxidized, and that the wettability thereof will deteriorate. In addition, if the semiconductor chip 202a is stacked with the electrode 234 in an oxidized state, it is difficult for solder alloy to be formed in the bond portion between the solder layer 240 and the electrode 234, thereby creating the problem of conduction failures occurring between electrodes. This results in there being a reduced yield of three-dimensionally packaged semiconductor devices.

The present invention was conceived in order to solve the above described problems and it is an object thereof to provide a method of manufacturing a semiconductor device, a semiconductor device, a circuit substrate, and an electronic apparatus in which short circuiting between signal wiring and a ground is prevented, and in which the problem of conduction failures occurring between electrodes during stacking is prevented.

SUMMARY OF THE INVENTION

The first aspect of the present invention is a method of manufacturing a semiconductor device having electrodes penetrating a semiconductor substrate, the method has the steps of forming a concave portion extending from an active surface of a semiconductor substrate on which an integrated circuit is formed to an interior of the semiconductor substrate, forming a first insulating layer on an inner surface of the concave portion, filling an inner side of the first insulating layer with an electroconductive material so as to form an electrode, exposing a distal end portion of the first insulating layer by etching a rear surface of the semiconductor substrate, forming a second insulating layer on a rear surface of the substrate, and exposing the distal end portion of the electrode by removing the first insulating layer and the second insulating layer from a distal end portion of the electrode.

According to this aspect, while exposing the distal end portion of the electrode at the rear surface of the semiconductor substrate, it is possible to form the second insulating layer at the periphery thereof. As a result, even if the bonded members between the electrodes are deformed when the semiconductor devices are stacked, it is possible to prevent short-circuiting between the bonded members and the rear surface of the semiconductor substrate. Accordingly, short-circuiting between the signal wiring and the ground can be prevented.

It is desirable that the method further have a step of attaching, before the rear surface of the semiconductor substrate is etched, a reinforcing member that reinforces the semiconductor substrate to the active surface of the semiconductor substrate via a hardening adhesive agent.

By attaching this reinforcing member, when the rear surface of the semiconductor substrate is processed, it is possible to prevent cracks being generated in the substrate. Moreover, by attaching the reinforcing member via a hardening adhesive agent, the reinforcing member can be attached firmly while bumps and indentations in the rear surface of the semiconductor substrate are leveled off.

It is also desirable that the method further have the steps of forming, before the electrode is formed, a barrier layer that prevents the electroconductive material from spreading to the semiconductor substrate on an interior side of the first insulating layer, and exposing the distal end portion of the electrode by removing the barrier layer at the distal end portion of the electrode at the same time as removing the first insulating layer and the second insulating layer at the distal end portion of the electrode.

By employing this method, because the barrier layer can be removed at the same time as the first insulating layer and the second layer are removed, the manufacturing steps can be simplified.

It is preferable that, in the step of forming the second insulating layer, a coating of silicon oxide or silicon nitride that constitutes the second insulating layer be formed by a CVD method. It is also preferable that, in the step of forming the second insulating layer, a liquid SOG or polyimide that is a base material of the second insulating layer is coated using a spin coating method.

It is also desirable that the step for forming the electrode further have the steps of forming an electrode distal end portion formed from a first electroconductive material on a bottom surface of the concave portion on an inner side of the first insulating layer, and forming an electrode body that is formed from a second electroconductive material and is connected to the electrode distal end portion on an inner side of the first insulating layer, and wherein, in the step of exposing the electrode, the electrode distal end portion is exposed by removing the first insulating layer that is formed on top of a distal end surface of the electrode distal end portion, and wherein the first electroconductive material is less readily oxidized than the second electroconductive material.

According to this method, it is possible to form an electrode distal end portion, which is formed from an electroconductive material that is less readily oxidized than the material of the electrode body, at a distal end portion of the electrode body. As a result, it is possible to prevent the electrodes of the semiconductor device from becoming oxidized and the wettability thereof consequently deteriorating. Accordingly, even if the semiconductor devices are stacked after a lengthy period time has passed since the formation of the semiconductor devices, it is possible to bond the electrodes together so that conduction failures between electrodes can be avoided.

It is also desirable that, in the step of forming the electrode distal end portion, a liquid body containing the first electroconductive material be discharged using a droplet discharge apparatus onto the bottom surface of the concave portion on an inner side of the first insulating layer, and that the discharged liquid body is then baked.

By employing this method, it becomes possible to discharge a predetermined quantity of liquid onto the bottom surface of the concave portion, and to thereby form the electrode distal end portions with a high degree of precision.

The second aspect of the present invention is a method of manufacturing a semiconductor device having electrodes penetrating a semiconductor substrate, the method has the steps of forming a concave portion extending from an active surface of a semiconductor substrate on which an integrated circuit is formed to an interior of the semiconductor substrate, forming a first insulating layer on an inner surface of the concave portion, forming an electrode distal end portion formed from a first electroconductive material on a bottom surface of the concave portion on an inner side of the first insulating layer, forming an electrode body that is formed from a second electroconductive material and is connected to the electrode distal end portion on an inner side of the first insulating layer, exposing a distal end portion of the first insulating layer by etching a rear surface of the semiconductor substrate, and exposing the electrode distal end portion by removing the first insulating layer that is formed on a distal end surface of the electrode distal end portion, wherein the material used for the first electroconductive material is less readily oxidized than the material used for the second electroconductive material.

According to this aspect, it is possible to form an electrode distal end portion that is formed from an electroconductive material that is less readily oxidized than the electrode body on a distal end portion of the electrode body. As a result, it is possible to prevent the electrodes of the semiconductor device from becoming oxidized and the wettability thereof consequently deteriorating. Accordingly, even if the semiconductor devices are stacked after a lengthy period time has passed since the formation of the semiconductor devices, it is possible to bond the electrodes together so that conduction failures between electrodes can be avoided.

It is also desirable that, in the step of forming the electrode distal end portion, a liquid body containing the first electroconductive material be discharged using a droplet discharge apparatus onto the bottom surface of the concave portion on an inner side of the first insulating layer, and the discharged liquid body is then baked.

If this method is employed, it becomes possible to discharge a predetermined quantity of liquid onto the bottom surface of the concave portion, and to thereby form the electrode distal end portion with a high degree of precision.

It is also desirable that the method further have a step of forming, after the step of etching the rear surface of the semiconductor substrate, a second insulating layer on a rear surface of the semiconductor substrate, wherein, in the step of removing the first insulating layer that is formed on a distal end surface of the electrode distal end portion, the electrode distal end portion is exposed by removing the second insulating layer that is formed on the distal end surface of the electrode distal end portion.

If this method is employed, while exposing the distal end portion of the electrode at the rear surface of the semiconductor substrate, it is possible to form the second insulating layer at the periphery thereof. As a result, even if the bonded members between the electrodes are deformed when the semiconductor devices are stacked, it is possible to prevent short-circuiting between the bonded members and the rear surface of the semiconductor substrate. Accordingly, short-circuiting between the signal wiring and the ground can be prevented.

The third aspect of the present invention is a semiconductor device has a semiconductor substrate on which an integrated circuit is formed, an electrode formed via a first insulating layer inside a through hole extending from an active surface of the semiconductor substrate to a rear surface of the semiconductor substrate, and a second insulating layer formed on a rear surface of the semiconductor substrate in at least a periphery of the electrode.

According to this aspect, even if the bonded members between the electrodes are deformed when a plurality of semiconductor devices are stacked, it is possible to prevent short-circuiting between the bonding members and the rear surface of the semiconductor substrate. Accordingly, short-circuiting between the signal wiring and the ground can be prevented.

It is also possible for the distal end surface of the electrode on the rear side of the semiconductor substrate to be formed protruding from a surface of the second insulating layer If this structure is employed, then because it is possible to secure a spacing between the semiconductor devices when a plurality of semiconductor devices are stacked, the gaps between each semiconductor device can be easily filled with underfill or the like.

It is also possible for the distal end surface of the electrode on the rear side of the semiconductor substrate to be formed on substantially the same plane as a surface of the second insulating layer If this structure is employed, then when a plurality of semiconductor devices are stacked, no stress concentrations are generated in adjacent semiconductor devices, and three-dimensional packaging is possible without the semiconductor devices being broken.

It is also preferable that the second insulating layer be formed from silicon oxide, silicon nitride or polyimide.

The fourth aspect of the present invention is a semiconductor device has a semiconductor substrate on which an integrated circuit is formed, an electrode body formed via a first insulating layer inside a through hole extending from an active surface of the semiconductor substrate to a rear surface of the semiconductor substrate, and an electrode distal end portion formed at a distal end portion of the electrode body on a rear side of the semiconductor substrate, and formed from an electroconductive material that is less readily oxidized than the constituent material of the electrode body.

According to this aspect, it is possible to prevent the electrodes of the semiconductor device from becoming oxidized and the wettability thereof consequently deteriorating. Accordingly, even if the semiconductor devices are stacked after a lengthy period time has passed since the formation of the semiconductor devices, it is possible to bond the electrodes together so that conduction failures between electrodes can be avoided.

It is also preferable that the constituent material of the electrode distal end portion be gold or silver.

If this structure is employed, because gold or silver are particularly resistant to oxidization, it is possible to avoid conduction failures between electrodes. In addition, because an alloy is easily formed by the bonding members between the electrodes, it is possible to form the electrode distal end portions with an optional thickness.

Moreover, the second insulating layer is formed on a rear surface of the semiconductor substrate in at least a periphery of the electrode distal end portion.

If this structure is employed, even if the bonded members between the electrodes are deformed when a plurality of semiconductor devices are stacked, it is possible to prevent short-circuiting between the bonding members and the rear surface of the semiconductor substrate. Accordingly, short-circuiting between the signal wiring and the ground can be prevented.

It is also possible for the distal end surface of the electrode distal end portion to be formed protruding from a surface of the second insulating layer.

If this structure is employed, then because it is possible to secure a spacing between the semiconductor devices when a plurality of semiconductor devices are stacked, the gaps between each semiconductor device can be easily filled with underfill or the like.

In addition, the distal end surface of the electrode distal end portion is formed on substantially the same plane as a surface of the second insulating layer.

If this structure is employed, then when a plurality of semiconductor devices are stacked, no stress concentrations are generated in adjacent semiconductor devices, and three-dimensional packaging is possible without the semiconductor devices being broken.

The fifth aspect of the present invention is a semiconductor device manufactured using the above described method of manufacturing a semiconductor device.

According to this aspect, a semiconductor device can be provided that furnishes the above described effects.

The sixth aspect of the present invention is a semiconductor device in which a plurality of the above described semiconductor devices are stacked, and either the electrodes of vertically adjacent semiconductor devices are electrically connected by solder or by a brazing material, or the electrode distal end portion of one of the vertically adjacent semiconductor devices is electrically connected by solder or by a brazing material to the electrode body of the other of the vertically adjacent semiconductor devices.

According to this aspect, even if the solder or brazing material is deformed when a plurality of the semiconductor chips are stacked, it is possible to prevent short-circuiting between the solder or brazing material and the rear surface of the semiconductor substrate. Accordingly, short-circuiting between the signal wiring and the ground can be prevented.

The seventh aspect of the present invention is a circuit substrate on which the above described semiconductor device is packaged.

According to this aspect, a circuit substrate can be provided that furnishes the above described effects.

The eighth aspect of the present invention is an electronic apparatus that is provided with the above described semiconductor device.

According to this aspect, an electronic apparatus can be provided that furnishes the above described effects.

BRIEF DESCRIPTION OF THE DRAWINGS

FIG. 1 is a side cross-sectional view of electrode portions of a semiconductor chip according to the first embodiment.

FIG. 12 is a side cross-sectional view of electrode portions of a semiconductor chip according to the third embodiment.

FIG. 19 is a perspective view of a mobile telephone as an example of an electronic apparatus.

FIG. 20 is a side cross-sectional view of an entire semiconductor device according to the conventional technology.

DETAILED DESCRIPTION OF THE INVENTION

Figure 2A:
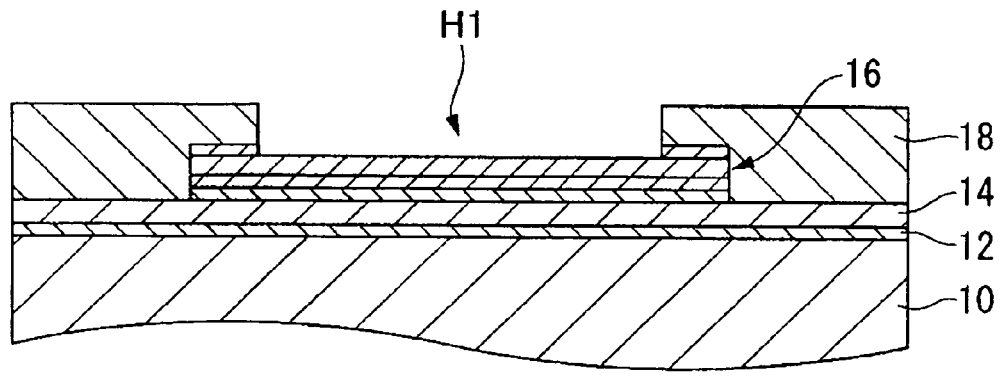
FIGS. 2A to 2C are explanatory views of a method of manufacturing a semiconductor chip according to the first embodiment.

Embodiments of the present invention will now be described with reference made to the drawings.

Note that in the respective drawings used in the description below, the scale of each member has been appropriately altered in order to make each member an easily recognized size.

(First Embodiment)

Firstly, a semiconductor chip that is the first embodiment of the semiconductor device according to the present invention will be described using FIG. 1.

FIG. 1 is a side cross-sectional view of electrode portions of a semiconductor chip according to the present embodiment.

The semiconductor chip 2 according to the present embodiment has a semiconductor substrate 10 on which an integrated circuit is formed, an electrode 34 that is formed via an insulating film 22, which is a first insulating layer, inside a through hole H4 that extends from an active surface 10a of the semiconductor substrate 10 to a rear surface 10b of the semiconductor substrate 10, and an insulating film 26, which is a second insulating layer, formed on the rear surface 10b of the substrate 10.

(Semiconductor Device)

In the semiconductor chip 2 shown in FIG. 1, an integrated circuit (not shown) formed by a transistor, memory device, or some other electronic device is formed on the surface 10a of the semiconductor substrate 10, which is formed from Si (silicon) or the like. An insulating film 12 formed by SiO$_2$ (silicon oxide) or the like is formed on the active surface 10a of the semiconductor substrate 10. In addition, an interlayer insulating film 14 formed from boron phosphorus silicate glass (referred to below as BPSG) is formed on a surface of the insulating film 12.

Electrode pads 16 are formed at predetermined portions of a surface of the interlayer insulating film 14. The electrode pads 16 are formed by stacking a first layer 16a formed from titanium (Ti) or the like, a second layer 16b formed from titanium nitride (TiN), a third layer 16c formed from aluminum/copper (AlCu), and a fourth layer (a capping layer) 16d formed from TiN in that order. Note that the constituent material used for the electrode pads 16 may be appropriately selected in accordance with the electrical characteristics, physical characteristics, and chemical characteristics required of the electrode pads 16. Namely, it is possible to form the electrode pads 16 using only Al which is typically used for electrodes in integrated circuits, or to form the electrode pads 16 using only Cu, which has low electrical resistance.

As viewed in plan view, the electrode pads 16 are formed in a row at peripheral portions of the semiconductor chip 2. Note that there are cases when the electrode pads 16 are formed in a row at peripheral portions of the semiconductor chip 2, and cases when the electrode pads 16 are formed in a row at a center portion of the semiconductor chip 2. When the electrode pads 16 are formed at peripheral portions, they are formed in a row along at least one side (if there is a large number of electrode pads 16, this may be two sides or four sides) of the semiconductor chip 2. Each electrode pad 16 is electrically connected to locations (not shown) of the aforementioned integrated circuit. Note that it is necessary to pay attention to those points below the electrode pads 16 where the integrated circuit is not formed.

A passivation film 18 is formed on a surface of the interlayer insulating film 14 so as to cover the electrode pads 16. The passivation film 18 may be formed from SiO$_2$, SiN (silicon nitride), polyimide resin, and the like, and is formed at a thickness of, for example, approximately 1 µm.

An aperture portion H1 in the passivation film 18 and an aperture portion H2 in the electrode pad 16 are formed in a central portion of the electrode pad 16. The diameter of the aperture portion H2 is set smaller than the diameter of the aperture portion H1 and may be, for example, approximately 60 µm. In addition, the fourth layer 16d of the electrode pad 16 has an opening of approximately the same diameter as the aperture portion H1. On the other hand, an insulating film 20 formed from SiO$_2$ is formed at a surface of the passivation film 18 and also at inner surfaces of the aperture portion H1 and the aperture portion H2.

A hole portion H3 that penetrates the insulating film 20, the interlayer insulating film 14, the insulating film 12, and the semiconductor substrate 10 is formed at a central portion of the electrode pad 16. The diameter of the aperture portion H3 is set smaller than the diameter of the aperture portion H2 and may be, for example, approximately 30 µm. Note that the configuration of the aperture portion H3 is not limited to a circular configuration when seen in plan view, and a rectangular configuration when seen in plan view may also be employed. The through hole H4 that penetrates from the active surface to the rear surface of the semiconductor substrate is formed by the aperture portion H1, the aperture portion H2, and the hole portion H3.

An insulating film 22, which is the first insulating layer, is formed on an inner surface of the through hole H4 and on a surface of the insulating film 20. The insulating film 20 prevents the generation of current leaks, and also prevents corrosion and the like caused by oxygen, moisture and the like, and is formed having a thickness of approximately 1 µm. The insulating film 22 is also formed protruding from the rear surface 10b of the semiconductor substrate 10. In contrast, the insulating film 20 and the insulating film 22 that are formed on a surface of the third layer 16c of the electrode pads 16 are partially removed along peripheral edges of the aperture portion H2.

A base film 24 is formed on a surface of the third layer 16c of the electrode pad 16 that is exposed by this, and on the remaining surface of the insulating film 22. The base film 24 is formed by a barrier layer (i.e., a barrier metal) that is formed on a surface of the insulating film 22 and the like, and a seed layer (i.e., a seed electrode) that is formed on a surface of the barrier layer. The barrier layer is provided in order to prevent the constituent material of the electrode 34, which is described below, from scattering onto the substrate 10, and is formed from titanium tungsten (TiW), titanium nitride (TiN), tantalum nitride (TaN) and the like. The seed layer is provided as an electrode when forming the electrode 34 described below by plating processing, and is formed from Cu, Au, Ag and the like.

The electrode 34 is formed on an inner side of the base film 24. The electrode 34 is formed from an electroconductive material having low electrical resistance such as Cu or W. Note that if the electrode 34 is formed using an electroconductive material obtained by doping an impurity such as B or P in polysilicon (poly-si), then it is not necessary to prevent scattering onto the substrate 10. Consequently, the aforementioned barrier layer is unnecessary. A plug portion 36 of the electrode 34 is formed by forming the electrode 34 in the through hole H4. Note that the plug portion 36 and the electrode pad 16 are electrically connected via the base film 24 in the P portion shown in FIG. 1. In addition, a bottom end surface of the plug portion 36 is exposed to the outside. In contrast, a post portion 35 of the electrode 34 is formed by extending the electrode 34 to peripheral edge portions of the aperture portion H1, which are above the passivation film 18. The configuration of the post portion 35 is not limited to a circular configuration when seen in plan view, and a rectangular configuration when seen in plan view may also be employed.

An insulating film 26, which is a second insulating film, is formed on a rear surface 10b of the semiconductor substrate 10. The insulating film 26 is formed from an inorganic substance such as silicon oxide (SiO$_2$), silicon nitride (SiN), and the like or from an organic substance such as polyimide (PI). The insulating film 26 is formed over the entire rear surface 10b of the semiconductor substrate 10 apart from the bottom end surface of the plug portion 36 of the electrode 34. Note that it is also possible to form the insulating film 26 selectively in only the vicinity of the distal end portion of the electrode 34 on the rear surface 10b of the semiconductor substrate 10.

Note that, in the first embodiment, the distal end surface of the plug portion 36 of the electrode 34 on the rear side of the substrate 10 is formed protruding from the surface of the insulating film 26. The height of the protrusion of the plug portion 36 may be set at, for example, approximately 10 μm to 20 μm. As a result, because it is possible to secure a space between semiconductor chips when stacking a plurality of semiconductor chips, it is possible to easily fill gaps between each semiconductor chip with underfill or the like. Note that, it is possible to adjust intervals between stacked semiconductor chips by adjusting the height of the protrusion of the plug portion 36. Moreover, instead of filling the gaps with underfill after the stacking, even when a thermosetting resin or the like is coated on the rear surface 10b of a semiconductor chip 2 before it is stacked, because it is possible to coat the thermosetting resin or the like while avoiding the protruding plug portion 36, the wiring of the semiconductor chip can be reliably connected.

A solder layer 40 is formed on a top surface of the post portion 35 of the electrode 34. The solder layer 40 may be formed by a typical PbSn alloy or the like, however, from an environmental standpoint, it is preferable that it is formed by a lead free solder material such as a SnAg alloy. Note that, instead of the solder layer 40, which is a soft solder material, it is also possible to form a hard solder material (i.e., a molten metal) layer from a SnAg alloy or the like, or to form a metal paste layer from Ag paste or the like. It is preferable, from an environmental standpoint, that this hard solder material layer and metal paste layer are also formed from a lead free material. The semiconductor chip 2 according to the present embodiment has the above described structure.

(Manufacturing Method)

Next, a method of manufacturing the semiconductor chip according to the present embodiment will be described using FIGS. 2A to 6B.

FIGS. 2A to 6B are explanatory views showing a method of manufacturing a semiconductor chip according to the present embodiment. Note that the description below is of a case in which processing is performed simultaneously on a plurality of semiconductor chip formation areas on a semiconductor substrate, however, the processing described below may also be performed on each individual semiconductor chip.

Firstly, as shown in FIG. 2A, the insulating film 12 and the interlayer insulating film 14 are formed on a surface of the semiconductor substrate 10. Electrode pads 16 are then formed on a surface of the interlayer insulating film 14. Specifically, firstly, the first layer through fourth layer of the electrode pads 16 are formed in sequence over the entire surface of the interlayer insulating film 14. Each layer may be formed by sputtering or the like. Next, resist or the like is coated on the resulting surface. The ultimate configuration of each electrode pad 16 is patterned on the resist using photolithographic technology. Etching is then performed using the patterned resist as a mask, so that the electrode pad is formed in a predetermined configuration (for example, a rectangular configuration). Subsequently, the passivation film 18 is formed on the surface of the electrode pads 16.

Next, the aperture portion H1 is formed in the passivation film 18. Specifically, this process involves, firstly, coating resist or the like on the entire surface of the passivation film. The resist may be any of photo resist, electron beam resist, and x-ray resist, and may be either a positive type or a negative type. The coating of the resist may be performed using a spin coating method, a dipping method, a spray coating method, or the like. Prebaking is performed after the coating of the resist. Exposure processing is then performed on the resist using a mask on which the pattern of the aperture portion H1 has been formed. By then performing developing processing the configuration of the aperture portion H1 is patterned onto the resist. Post baking is performed after the resist has been patterned.

The passivation film 18 is then etched using the patterned resist as a mask. Note that, in the present embodiment, the fourth layer of the electrode pad 16 is etched together with the passivation film 18. Wet etching may be employed for the etching, however, it is preferable that dry etching be employed. The dry etching may be reactive ion etching (RIE). After the aperture portion H1 has been formed in the passivation film 18, the resist is peeled off the passivation film 18 using a peeling solution. As a result of this, as shown in FIG. 2A, the aperture portion H1 is formed in the passivation film 18 and the electrode pad 16 is exposed.

Figure 2B:
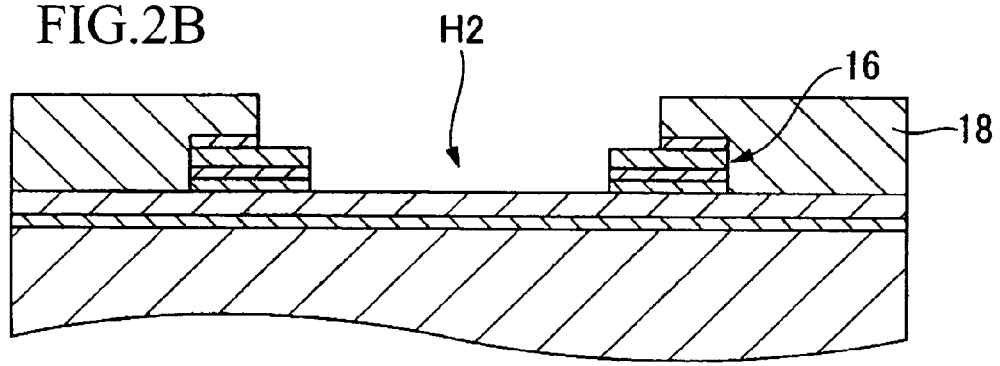

Next, as shown in FIG. 2B, the aperture portion H2 is formed in the electrode pad 16. Specifically, this process involves, firstly, coating resist or the like over the entire surface of the exposed electrode pad 16 and passivation film 18, and then patterning the configuration of the aperture portion H2. Next, the electrode pad 16 is dry etched using the patterned resist as a mask. RIE can be used for the dry etching. Subsequently, as shown in FIG. 2B, once the resist is peeled off the aperture portion H2 is formed in the electrode pad 16.

Figure 2C:
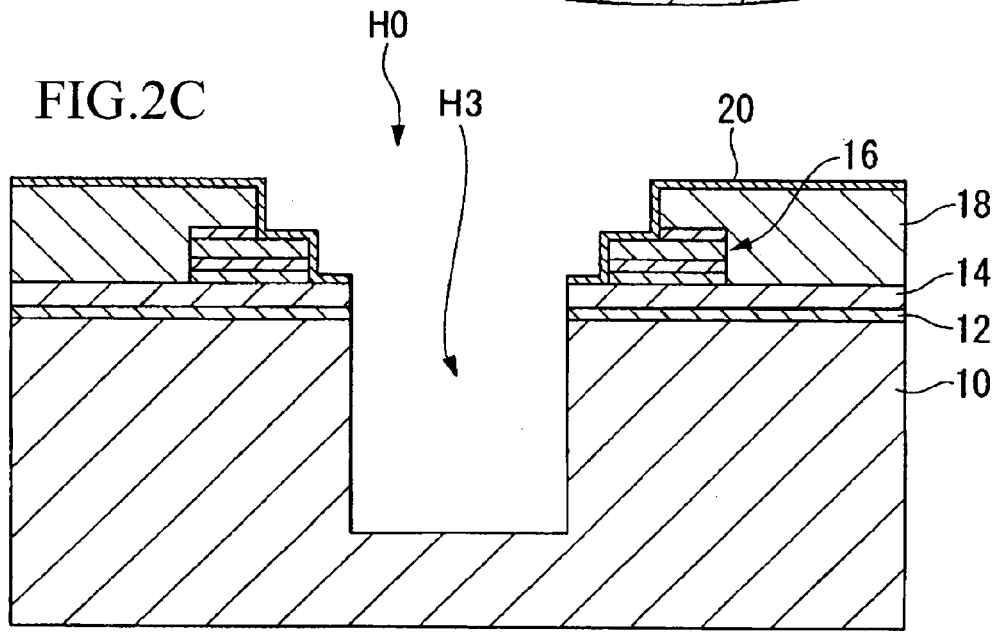

Next, as shown in FIG. 2C, the insulating film 20 is formed on the entire upper surface of the substrate 10. This insulating film 20 functions as a mask when the hole portion H3 is opened in the substrate 10 by dry etching. The depth of the insulating film 20 may be set at, for example, approximately 2 μm based on the depth of the hole portion H3 formed in the substrate 10. In the present embodiment, $SiO_2$ is used for the insulating film 20, however, photo resist may also be used provided that an appropriate selectivity ratio with the Si can be obtained. For the insulating film 20 it is also possible to use tetra ethyl ortho silicate ($Si(OC_2H_5)_4$: referred to below as TEOS) that is formed using plasma enhanced chemical vapor deposition (PECVD), namely, PE-TEOS, or $O_3$-TEOS, which is a thermal CVD that uses ozone, or a silicon oxide formed using CVD, or the like.

Next, the configuration of the hole portion H3 is patterned onto the insulating film 20. Specifically, firstly, this process involves coating resist or the like on the entire surface of the insulating film 20, and then patterning the configuration of the hole portion H3. Next, the insulating film 20, the interlayer insulating film 14, and the insulating film 12 are dry etched using the patterned resist as a mask. Subsequently, once the resist is peeled off, the configuration of the hole portion H3 is patterned in the insulating film 20 and the like, and the substrate 10 is exposed.

Next, the hole portion H3 is opened in the substrate 10 using high-speed dry etching. RIE and inductively coupled plasma (ICP) can be used for this dry etching. At this time, as is described above, the insulating film 20 ($SiO_2$) is used as a mask, however, instead of the insulating film 20 it is also possible to use resist as the mask. The depth of the hole portion H3 is appropriately set in accordance with the thickness of the semiconductor chip that is ultimately formed. Namely, after the semiconductor chip has been etched to its ultimate thickness, the depth of the hole portion H3 is set such that the distal end portion of the electrode formed inside the hole portion H3 can be exposed at the rear surface of the substrate 10. As a result of the above, as shown in FIG. 2C, the hole portion H3 is formed in the substrate 10. A concave portion H0 extending from the active surface of the substrate 10 to the interior thereof is formed by the aperture portion H1, the aperture portion H2, and the hole portion H3.

Figure 3A:
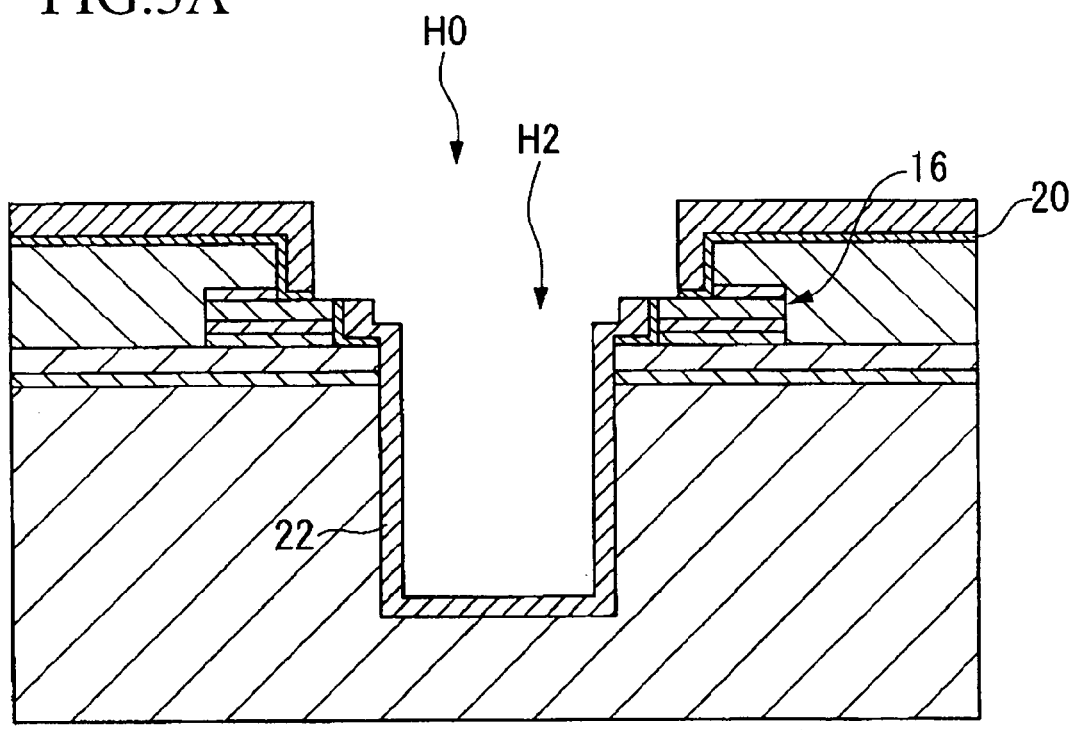
FIGS. 3A and 3B are explanatory views of a method of manufacturing a semiconductor chip according to the first embodiment.

Next, as shown in FIG. 3A, an insulating film 22, which is a first insulating film, is formed on the inner surface of the concave portion H0 and on the surface of the insulating film 20. The insulating film 22 may be formed, for example, from PE-TEOS or $O_3$-TEOS, and is formed having a surface film thickness of approximately 1 μm by, for example, plasma TEOS or the like.

Next, a portion of the electrode pad 16 is exposed by performing anisotropic etching on the insulating film 22 and the insulating film 20. In the present embodiment, A portion of the surface of the electrode pad 16 is exposed along the periphery of the aperture portion H2. Specifically, this procedure involves, firstly, coating resist or the like on the entire surface of the insulating film 22, and then patterning the exposed portion. Next, anisotropic etching is performed on the insulating film 22 and the insulating film 20 using the patterned resist as a mask. Dry etching such as RIE may be favorably used for this anisotropic etching. As a result of the above, the state shown in FIG. 3A is obtained.

Figure 3B:
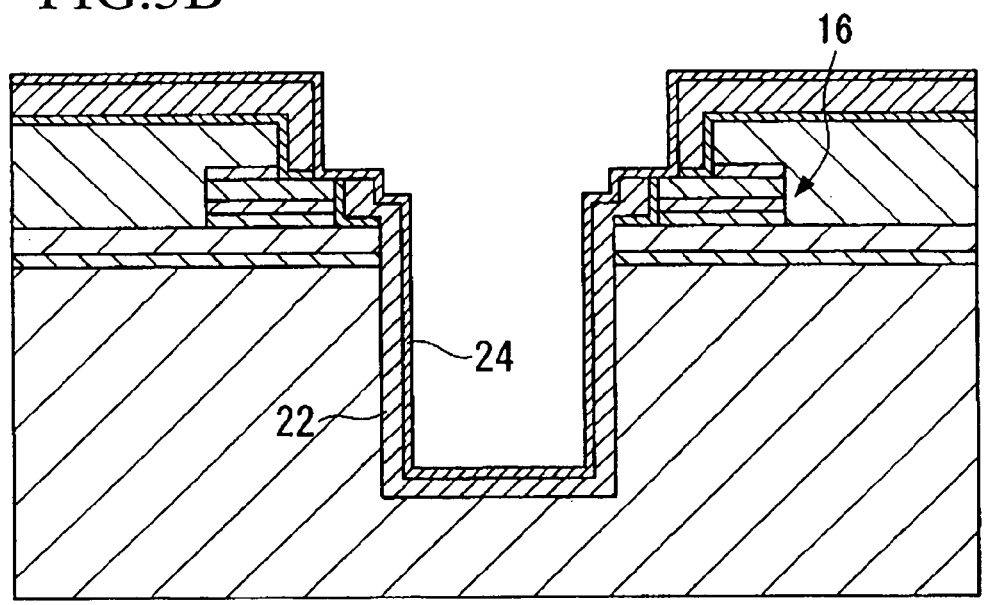

Next, as shown in FIG. 3B, the base film 24 is formed on the surface of the exposed electrode pad 16 and on the surface of the remaining insulating film 22. To form the base film 24, firstly, a barrier layer is formed, and then a seed layer is formed thereon. The barrier layer and seed layer may be formed using, for example, a physical vapor deposition (PVD) method such as vacuum deposition, sputtering, and ion plating, a CVD method, an ion metal plasma (IMP) method, a non-electrolytic galvanizing method, or the like.

Figure 4A:
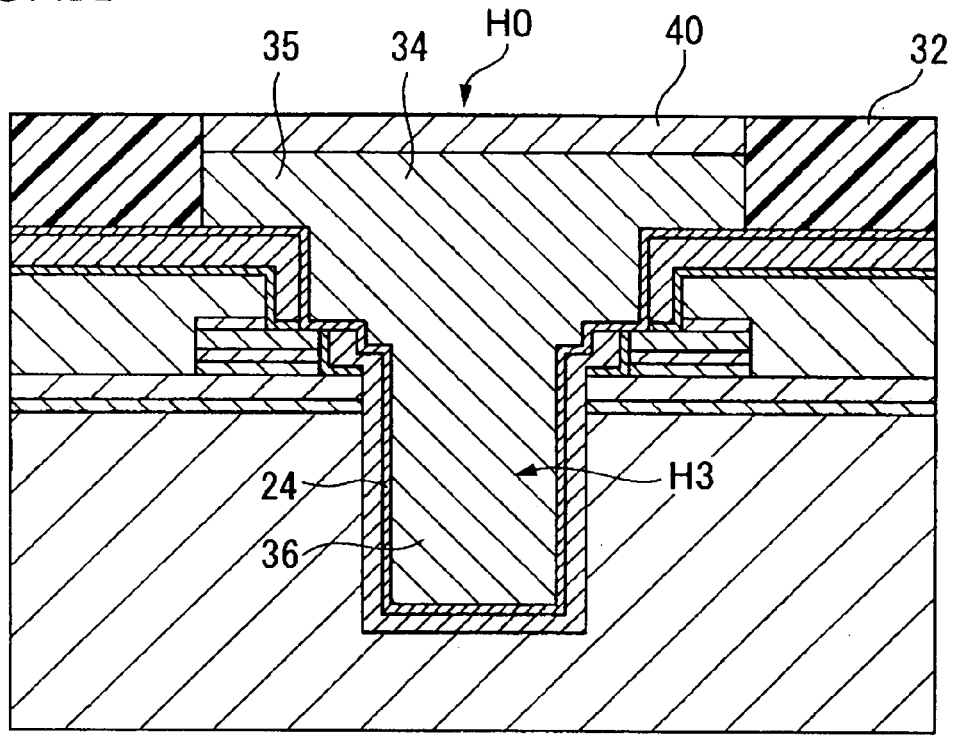
FIGS. 4A and 4B are explanatory views of a method of manufacturing a semiconductor chip according to the first embodiment.

Next, as shown in FIG. 4A, the electrode 34 is formed. Specifically, this process involves, firstly, coating resist 32 on the entire upper surface of the substrate 10. Liquid resist used for plating or a dry film can be employed for the resist 32. Note that, it is also possible to use a resist that is used when etching an Al electrode that is typically provided in a semiconductor device or like to use a resin resist that has insulating properties, however, naturally these must be able to withstand the plating solution and the etching solution that are used in the processes described below.

The coating of the resist 32 is performed using a spin coating method, a dipping method, or a spray coating method. Here, the thickness of the resist 32 is set to approximately the same size as the height of the post portion 35 of the electrode 34 that is being formed when the thickness of the solder layer 40 is added thereto. Prebaking is performed after the coating of the resist 32.

Next, the planar configuration of the post portion 35 of the electrode 34 being formed is patterned on the resist. Specifically, the resist 32 is patterned by performing exposure processing and developing processing using a mask on which a predetermined pattern has been formed. Here, if the planar configuration of the post portion 35 is rectangular, a rectangular aperture portion is patterned on the resist 32. The size of the aperture portion is set in accordance with the pitch of the electrodes 34 on the semiconductor chip and the like, and the aperture portion may be formed in a square, for example, with 120 μm sides or 80 μm sides. Note that the size of the aperture portion is set such that the resist 32 does not collapse after patterning.

The above is a description of a method of forming the resist 32 such that it surrounds the post portion 35 of the electrode 34. However, it is, of course, not absolutely necessary to form the resist 32 such that it surrounds the entire circumference of the post portion 35. For example, if the electrodes 34 are formed adjacent to each other only in a left-right direction as viewed in FIG. 4A, then it is not necessary to form the resist 32 in the depth direction (when viewed three dimensionally) of FIG. 4A. In this way, the resist 32 is formed along at least a portion of the exterior configuration of the post portion 35.

Note that the above is a description of a method of forming the resist 32 using photolithographic technology. However, if the resist 32 is formed using this method, then when the resist is coated over the entire surface, a portion thereof enters into the hole portion H3 and there is a concern that this portion will remain as residue inside the hole portion H3 even if developing processing is performed. Therefore, it is preferable that the resist 32 is formed in a patterned state, for example, by using a dry film, or by using a printing method such as screen printing or the like. It is also possible to form the resist 32 in a patterned state by using a droplet discharge apparatusesuch as an inkjet apparatus or the like to discharge droplets of resist only on positions where the resist 32 is to be formed. If this method is employed, the resist 32 can be formed without resist entering into the hole portion H3.

Next, the concave portion H0 is filled with electrode material using the resist 32 as a mask, so as to form the electrodes 34. This filling of the electrode material is performed by plating processing or by a CVD method or the like. In the plating processing, for example, an electrochemical plating (ECP) method is employed. Note that the seed layer forming the base film 24 is used as the electrode in the plating processing, and a cup type of plating apparatus is used as the plating apparatus. A cup type of plating apparatus has the characteristic that it forms a plating by discharging a plating solution from a cup shaped container. As a result of this, the interior of the concave portion H0 is filled with electrode material, so that the plug portion 36 is formed. The aperture portion formed in the resist 32 is also filled with electrode material, so that the post portion 35 is formed.

Next, a solder layer 40 is formed on a top surface of the electrode 34. The formation of the solder layer 40 is performed by a solder plating method or a printing method such as a screen printing method or the like. Note that the seed layer forming the base film 24 can be used as the electrode for the solder plating, and a cup type of plating apparatus can be used as the plating apparatus. Instead of the solder layer 40, it is also possible to form a hard solder material layer from SnAg or the like. A hard solder material layer can also be formed using a plating method or printing method. As a result of the above the state shown in FIG. 4A is obtained.

Figure 4B:
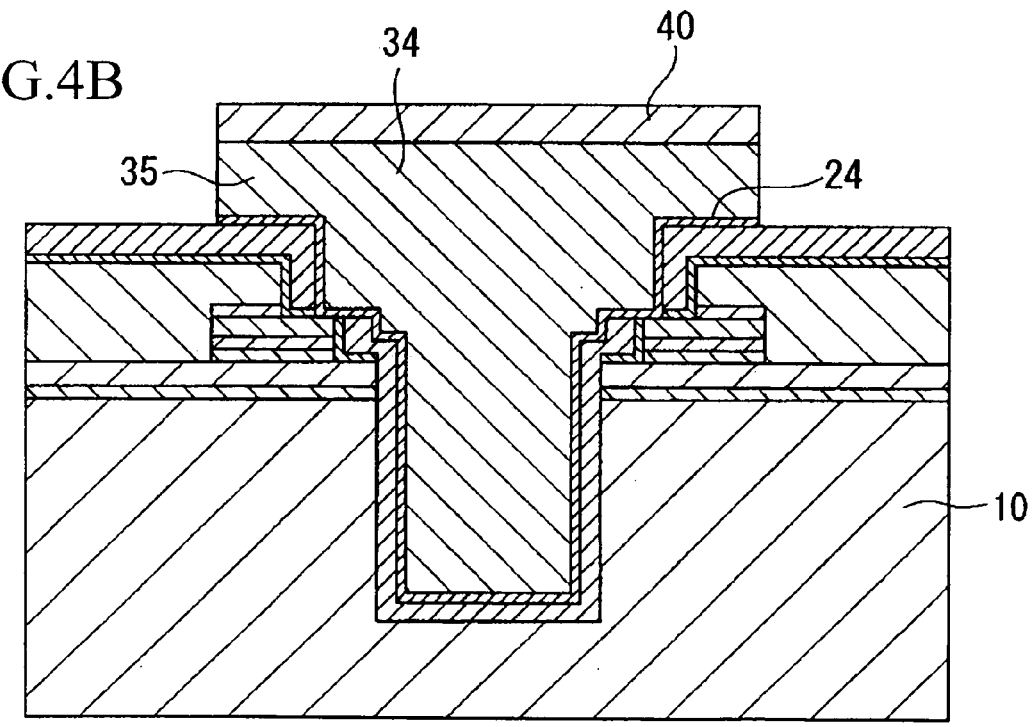

Next, as shown in FIG. 4B, the resist 32 is peeled off (i.e., removed) using a peeling solution or the like. Ozone water or the like can be used for the peeling solution. Next, the base film 24 that is exposed on the top of the substrate 10 is removed. Specifically, this procedure involves, firstly, coating resist or the like over the entire upper surface of the substrate 10, so as to pattern the configuration of the post portion 35 of the electrode 34. Next, the base film 24 is dry etched using the patterned resist as a mask. Note that, if a hard solder material layer is formed instead of the solder layer 40, then the base film 24 can be etched using the hard solder material layer as a mask. In this case, as no photolithography is needed, the manufacturing steps can be simplified.

Figure 5A:
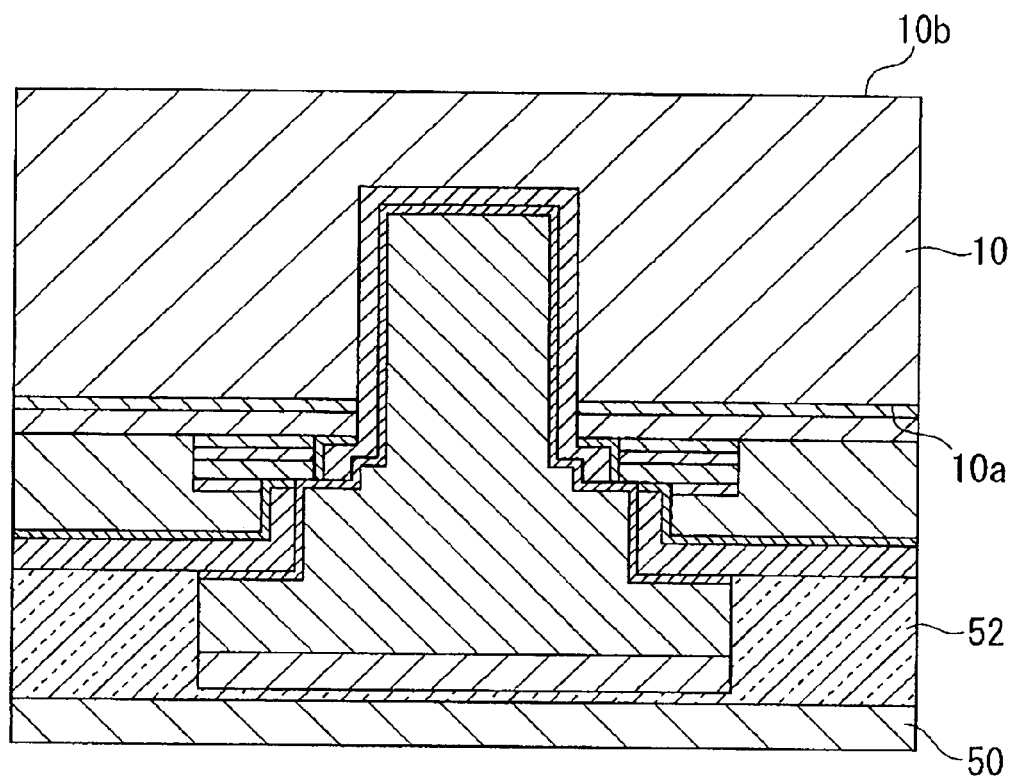
FIGS. 5A and 5B are explanatory views of a method of manufacturing a semiconductor chip according to the first embodiment.

Next, as shown in FIG. 5A, the substrate 10 is vertically inverted and a reinforcing member 50 is attached to the top of the substrate 10. A protective film or the like may be used as the reinforcing member 50, however, it is preferable that a hard material such as glass is used. By employing this structure, it is possible to prevent cracks and the like from occurring in the substrate 10 when the rear surface 10b of the substrate 10 is being processed. The reinforcing member 50 is adhered to the substrate 10 via an adhesive agent 52 or the like. It is desirable that a hardening adhesive agent such as a thermosetting adhesive agent or a photocurable adhesive agent be used as the adhesive agent 52. As a result of this, the reinforcing member 50 can be firmly adhered to the substrate 10 while bumps and indentations in the active surface 10a of the substrate 10 are absorbed. Furthermore, if a photocurable adhesive agent such as an ultraviolet thermosetting adhesive agent is used as the adhesive agent 52, then it is preferable that a transparent material such as glass be employed as the reinforcing member 50. In this case, by irradiating light from the exterior of the reinforcing member 50, the adhesive agent 52 can be easily hardened.

Figure 5B:
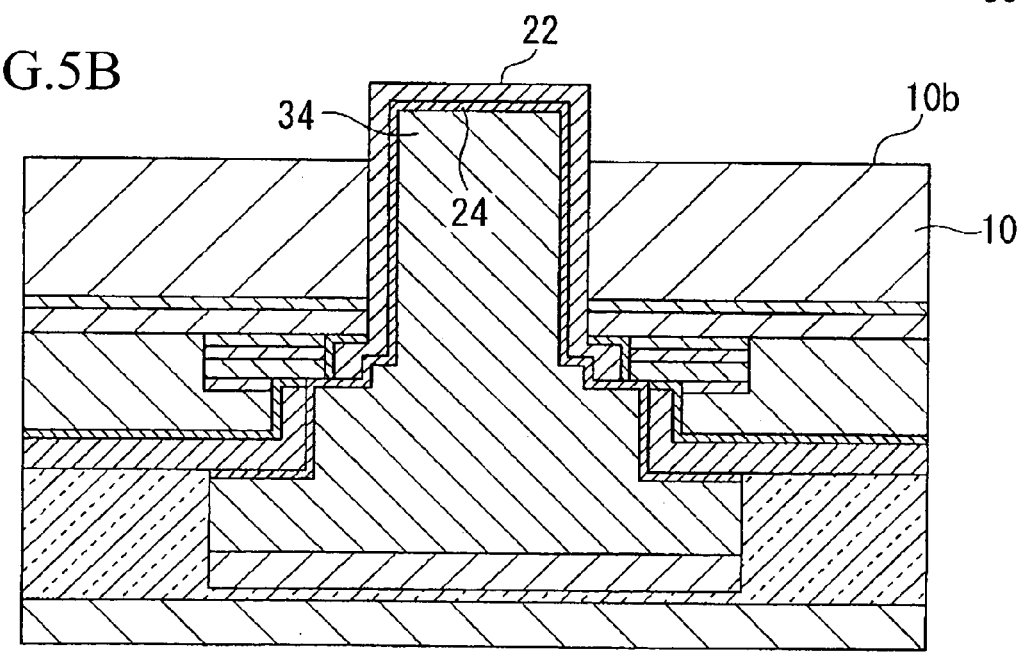

Next, as shown in FIG. 5B, the entire rear surface 10b of the substrate 10 is etched so that the distal end portion of the insulating film 22 is exposed, and the distal end portion of the electrode 34 is positioned further to the outside than the rear surface 10b of the substrate 10. Either wet etching or dry etching may be used for this etching. If etching is performed to expose the distal end portion of the insulating film 22 after the rear surface 10b of the substrate 10 has been roughly ground, then it is possible to shorten the manufacturing time. It is also possible to remove the insulating film 22 and the base film 24 by etching at the same time as the etching of the substrate 10 is being performed.

Figure 6A:
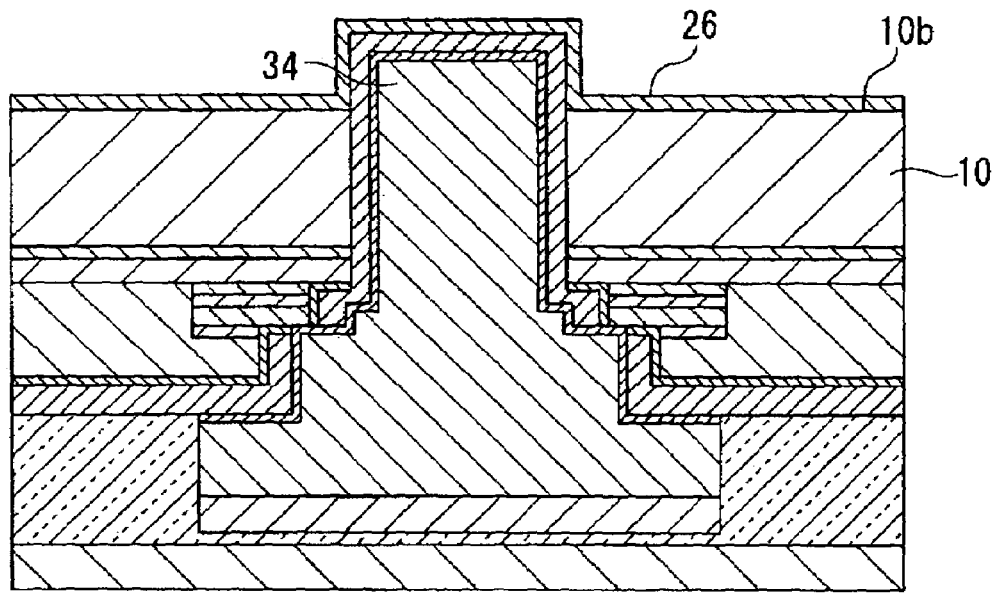
FIGS. 6A and 6B are explanatory views of a method of manufacturing a semiconductor chip according to the first embodiment.

Next, as shown in FIG. 6A, the insulating film 26, which is a second insulating layer, is formed over the entire rear surface 10b of the substrate 10. If a coating such as $SiO_2$ or SiN is formed as the insulating film 26, then it is preferable that the insulating film 26 is formed by a CVD method. If a coating such as PI is formed as the insulating film 26, then it is preferable that the insulating film 26 is formed by coating a liquid coating material using a spin coating method, and then drying and baking this material. It is also possible to form the insulating film 26 using spin on glass (SOG). SOG is a liquid that, after being coated, becomes $SiO_2$ by being baked at a temperature of approximately 400° C., and is used in LSI interlayer insulating films in order to flatten the surface. Specifically, SOG is a polymer having a siloxane bond for its fundamental structure, and is used with alcohol or the like as a solvent. When this SOG is coated, a spin coating method is used.

Note that, instead of forming the insulating film 26 over the entire rear surface 10b of the substrate 10, it is also possible to form the insulating film 26 selectively in only the periphery of the electrode 34 on the rear surface 10b of the substrate 10. In this case, liquid material of the insulating film is discharged only at the periphery of the electrode 34 using a droplet discharge apparatusesuch as an inkjet apparatus. This liquid material is then dried and baked to form the insulating film 26.

Figure 6B:
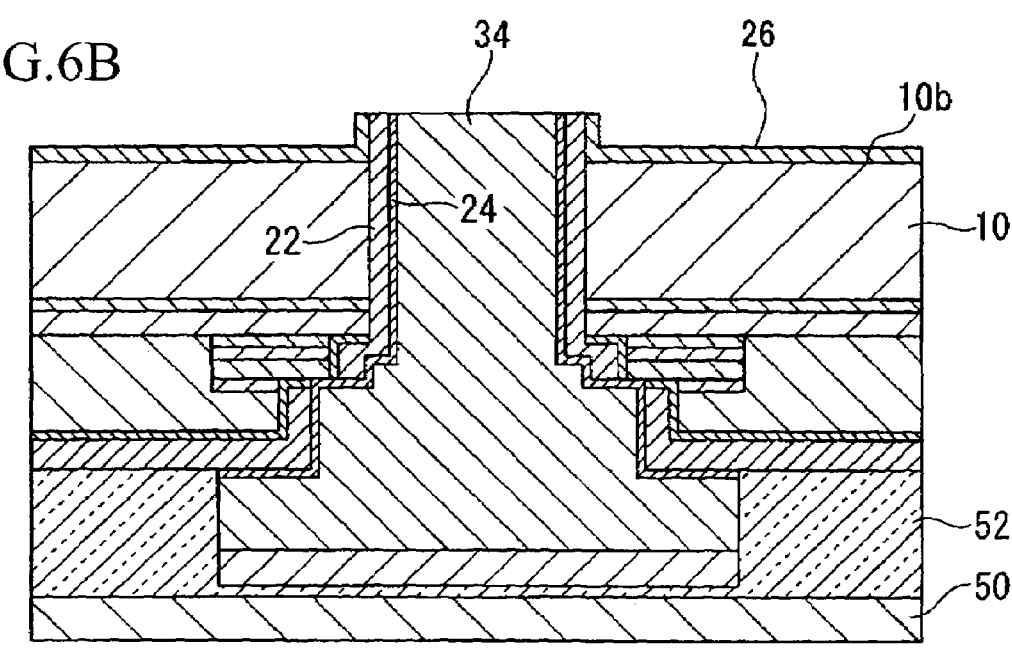

Next, as shown in FIG. 6B, the distal end portion of the electrode 34 is exposed. Specifically, the distal end portion of the electrode 34 is exposed by removing the insulating film 26, the insulating film 22, and the base film 24 that cover the distal end portion of the electrode 34. This removal of the insulating film 26, the insulating film 22, and the base film 24 can be performed by chemical and mechanical polishing (CMP). CMP is a method of grinding a substrate in which mechanical grinding of the substrate using an abrasive cloth combines with the chemical action of the grinding solution that is supplied to the mechanical grinding. Note that the distal end portion of the electrode 34 may also be ground when the insulating film 26, the insulating film 22, and the base film 24 are removed by grinding. In this case, because the base film 24 is completely removed, it is possible to prevent conduction failures between electrodes when the semiconductor chips are being stacked.

Next, the adhesive agent 52 is dissolved using a solvent or the like and the reinforcing member 50 is removed from the substrate 10. Next, after dicing tape (not shown) has been adhered to the rear surface 10b of the substrate 10, the substrate 10 is diced. As a result, the semiconductor chips are separated into individual pieces. It is also possible to cut the substrate 10 by irradiating a $CO_2$ laser or a YAG laser onto the substrate 10. As a result of the above, the state shown in FIG. 1 is obtained and the semiconductor chip 2 according to the present embodiment is completed.

(Stacking Structure)

A three dimensionally packaged semiconductor device is formed by stacking semiconductor chips 2 that have been formed in the manner described above.

Figure 7:
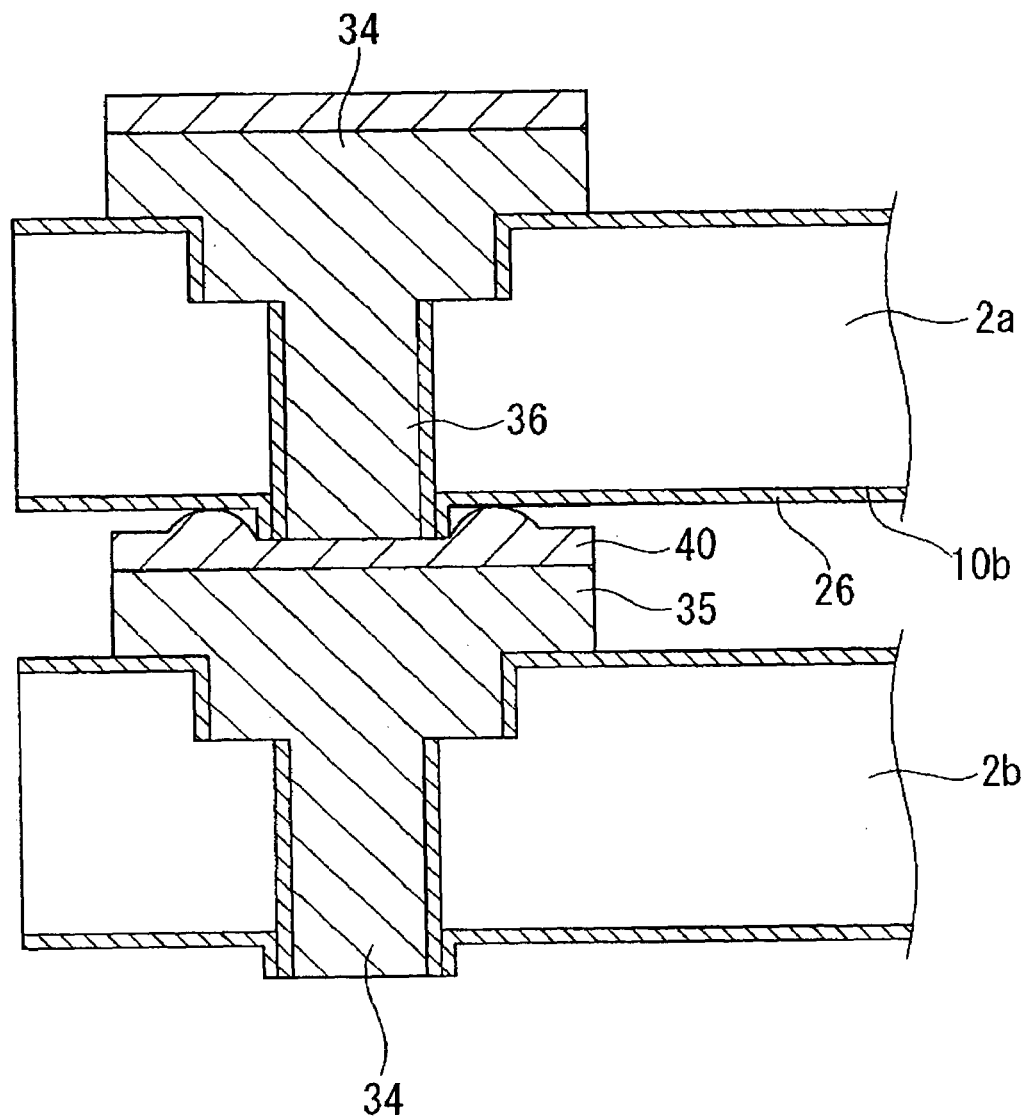
FIG. 7 is an explanatory view showing a state in which semiconductor devices according to the first embodiment are stacked.

FIG. 7 is a side cross-sectional view showing a state in which semiconductor chips according to the present embodiment are stacked and is an enlarged view of portions corresponding to A portion in FIG. 20.

The two semiconductor chips 2a and 2b are placed such that the bottom surface of the plug portion of the electrode 34 of the upper semiconductor chip 2a is positioned on a top surface of the post portion of the electrode 34 of the lower semiconductor chip 2b. The electrodes 34 in each semiconductor chip 2a and 2b are bonded together by inserting the solder layer 40. Specifically, the semiconductor chips 2a and 2b are compressed together while the solder layer 40 is melted by reflow. As a result, a solder alloy is formed in the bond portion between the solder layer 40 and the electrodes 34, and the two are bonded mechanically and electrically. Consequently a wiring connection is achieved between the semiconductor chips 2a and 2b. Note that, if necessary, gaps between each stacked semiconductor chip can be filled with underfill.

Note that, because the melted solder layer 40 is deformed upwards along the outer circumference of the plug portion 56 of the electrode in the upper semiconductor chip 2a, in some cases, the melted solder layer 40 comes into contact with the rear surface 10b of the upper semiconductor chip 2a. Because signal wiring is connected to the solder layer 40, and because a ground is connected to the rear surface 10b of the semiconductor chip 2a, it is necessary to prevent the two from short-circuiting. In the present embodiment, because the insulating film 26 is formed on the rear surface 10b of the semiconductor chip 2a, when stacking the semiconductor chips, it is possible to prevent the solder layer 40 short-circuiting with the rear surface 10b of the semiconductor chip 2a.

Accordingly, three-dimensional packaging can be performed while short-circuiting between the signal wiring and the ground is prevented.

In recent years, due to the demands for smaller and lighter semiconductor devices, extremely thin semiconductor chips have been formed by etching the rear surface of the semiconductor substrate to a considerable degree. Because of this, when a semiconductor substrate whose rear surface has been etched is processed, the semiconductor substrate is sometimes cracked and broken. Therefore, it has only been possible to perform the minimum amount of necessary processing on a semiconductor substrate whose rear surface has been etched. Accordingly, the idea of forming an insulating film on the rear surface of a semiconductor substrate has, hitherto, not arisen. Recently, however, technology that allows a semiconductor substrate whose rear surface has been etched to be freely processed has been developed by attaching a reinforcing member to the active surface of the semiconductor substrate before the rear surface of the semiconductor substrate is etched. In this reinforcing member attachment technology, the reinforcing member is attached while bumps and indentations in the active surface of the semiconductor substrate are absorbed, and the reinforcing member is also able to be freely removed after the processing of the semiconductor substrate. As a result of this, the idea of the present invention, namely, of forming an insulating film on the rear surface of a semiconductor substrate was first conceived.

(Relocated Wiring)

In order to package semiconductor devices formed in a stack in the manner described above on a circuit substrate, it is desirable that rewiring is performed. A brief description will first be given of rewiring.

Figure 8A:
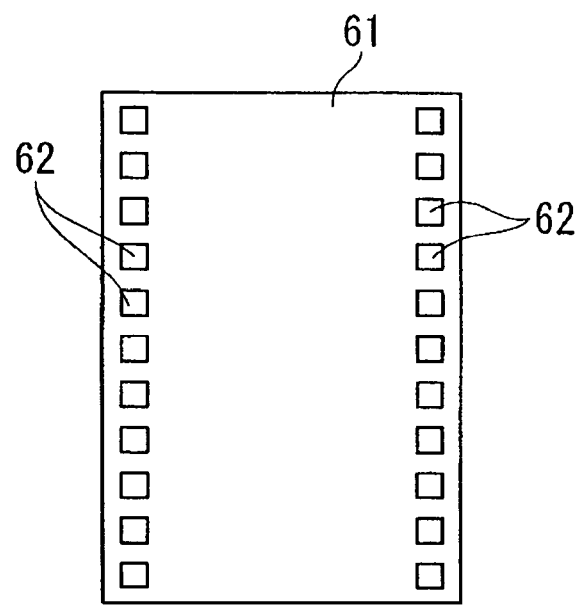
FIGS. 8A and 8B are explanatory views of rewiring.
Figure 8B:
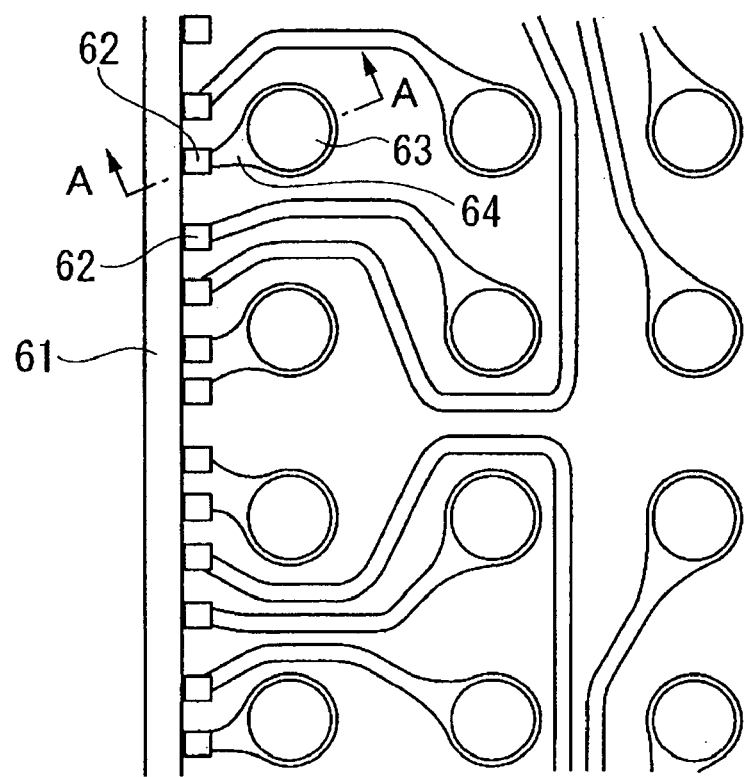

FIG. 8A and FIG. 8B are explanatory views showing the rewiring of a semiconductor chip.

Because a plurality of electrodes 62 are formed along opposite sides on a surface of the semiconductor chip 61 shown in FIG. 8A, the pitch between adjacent electrodes is narrowed. If a semiconductor chip 61 such as this is packaged on a circuit substrate, there is a concern that short-circuiting will occur between adjacent electrodes. Therefore, in order to broaden the pitch between electrodes, rewiring is performed in order to shift a plurality of electrodes 62 formed along opposite sides of the semiconductor chip 61 into a center portion.

FIG. 8B is a plan view showing a semiconductor chip that has undergone rewiring. A plurality of circular electrode pads 63 are formed in a matrix configuration in a center portion of a surface of the semiconductor chip 61. Each electrode pad 63 is connected to one of or a plurality of electrodes 62 by rewiring 64. As a result, the narrow pitched electrodes 62 are shifted into a center portion so that the pitch thereof is widened.

Figure 9:
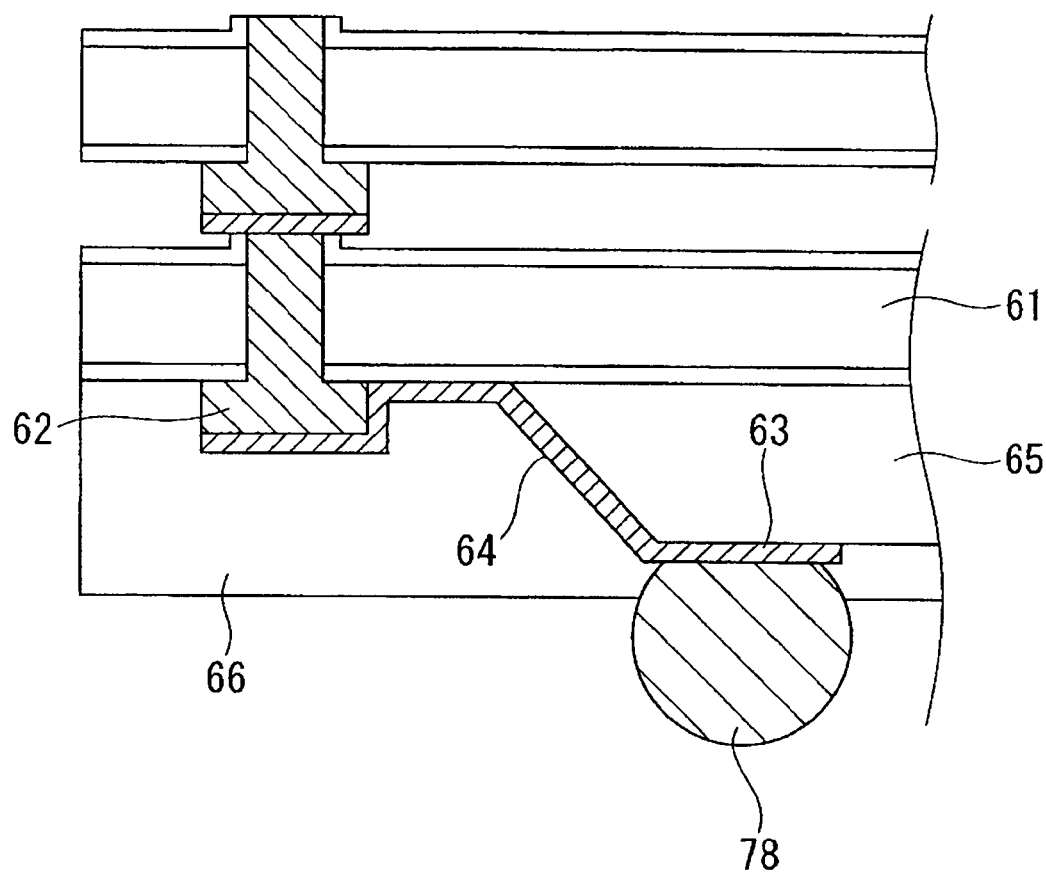
FIG. 9 is an explanatory view of rewiring.

FIG. 9 is a side cross-sectional view taken along the line A—A in FIG. 8B. Semiconductor devices formed in a stack, as is described above, are vertically inverted, and solder resist 65 is formed at a center portion of a bottom surface of the bottommost semiconductor chip 61. In addition, rewiring 64 is formed extending from a post portion of the electrode 62 to a surface of the solder resist 65. An electrode pad 63 is formed at an end portion on the solder resist 65 side of the rewiring 64, and a bump 78 is formed on a surface of this electrode pad. The bump 78 may be, for example, a solder bump, and is formed by a printing method or the like. Note that resin 66 or the like used for reinforcing is formed over the entire bottom surface of the semiconductor chip 61.

(Circuit Substrate)

Figure 10:
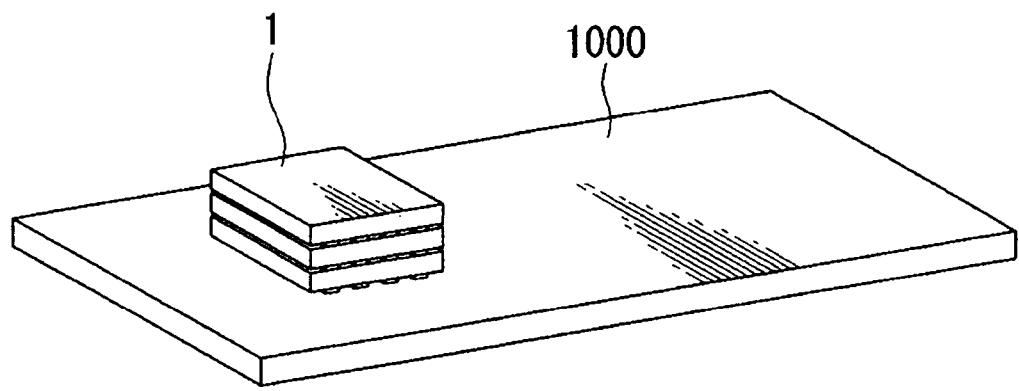
FIG. 10 is an explanatory view of a circuit substrate.

FIG. 10 is a perspective view of a circuit substrate.

In FIG. 10, a semiconductor device 1 that is formed by stacking semiconductor chips is packaged on a circuit substrate 1000. Specifically, bumps formed on the bottommost semiconductor chip of the semiconductor device 1 are packaged with electrode pads formed on a surface of the circuit substrate 1000 by performing reflow or flip chip bonding (FCP) or the like. Note that the semiconductor device 1 may also be packaged with an anisotropic electroconductive film inserted between the semiconductor device 1 and the circuit substrate.

(Second Embodiment)

Next, the semiconductor chip according to the second embodiment of the semiconductor device of the present invention, will be described using FIG. 11.

Figure 11:
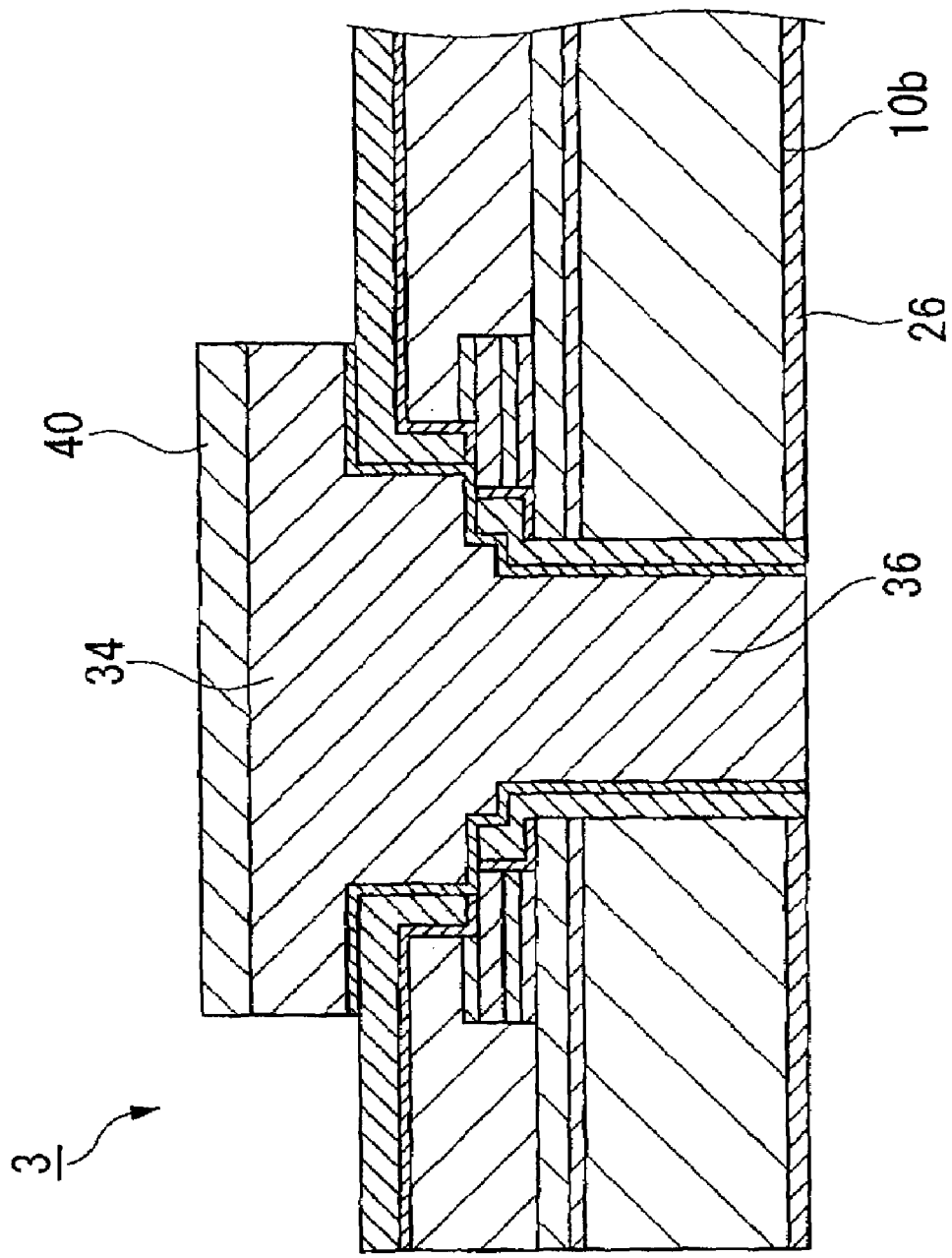
FIG. 11 is a side cross-sectional view of electrode portions of a semiconductor chip according to the second embodiment.

FIG. 11 is a side cross-sectional view of electrode portions of a semiconductor chip according to the present embodiment. The semiconductor chip 3 according to the second embodiment differs from the semiconductor chip 1 of the first embodiment only in that the distal end portion of the electrode 34 on the rear side of the semiconductor chip 3 is formed on substantially the same plane as the surface of the insulating film 26, which is the second layer. The remainder of the structure is the same as that of the first embodiment and a detailed description thereof is omitted here.

In the semiconductor chip 3 of the second embodiment, the bottom end surface of the plug portion 36a of the electrode 34 is formed on substantially the same plane as the surface of the insulating film 26 formed on the rear surface 10b of the semiconductor chip 3. When manufacturing the semiconductor chip 3 according to the second embodiment, the hole portion H3 shown in FIG. 2C is formed shallower than the hole portion H3 of the first embodiment. As a result, when etching the rear surface 10b of the substrate 10 shown in FIG. 5B, the height of the protrusion of the insulating film 22 is less than in the first embodiment. Furthermore, when forming the insulating film 26 on the rear surface 10b of the substrate 10 shown in FIG. 6A, the insulating film 26 is formed thicker than in the first embodiment. Moreover, when exposing the distal end portion of the electrode 34 shown in FIG. 6B by grinding, the distal end of the electrode 34 is exposed while the surface of the insulating film 26 is being ground. Consequently, as shown in FIG. 11, the bottom end surface of the plug portion 36 of the electrode 34 is exposed on substantially the same plane as the surface of the insulating film 26 that is formed on the rear surface 10b of the semiconductor chip 3.

In the semiconductor chip according to the second embodiment, in the same way as in the first embodiment, the insulating film 26 is formed on the rear surface 10b of the semiconductor chip 3.

Accordingly, as shown in FIG. 7, when stacking the respective semiconductor chips it is possible to prevent the solder layer 40 from short-circuiting with the rear surface 10b of the upper semiconductor chip. Accordingly, three-dimensional packaging can be performed while short-circuiting between signal wiring and a ground is prevented.

In the first embodiment, the bottom end of the plug portion 36 of the electrode 34 is formed so as to protrude from the surface of the insulating film 26. When the semiconductor chips are being stacked, because only the plug portions of the upper semiconductor chip are in contact with the lower semiconductor chip when the semiconductor chips are compressed together, there are cases in which concentrations of stress are generated in the lower semiconductor chip. As a result, there is the possibility that the lower semiconductor chip will crack or break. In contrast, in the second embodiment, the bottom end of the plug portion 36a of the electrode 34 is formed on substantially the same plane as the surface of the insulating film 26. As a result, no concentrations of stress are generated in the lower semiconductor chip when the semiconductor chips are compressed together during the stacking thereof, and it is possible to perform three-dimensional packaging while preventing the lower semiconductor chip from breaking. Note that the fact that it is possible to prevent short-circuiting between the signal wiring and the ground without forming the bottom end of the plug portion 36 such that it protrudes, as in the first embodiment, is in accordance with the above description.

(Third Embodiment)

Next, the semiconductor chip according to the third embodiment of the semiconductor device of the present invention will be described using FIG. 12.

FIG. 12 is a side cross-sectional view showing an electrode portion of a semiconductor chip according to the present embodiment. In FIG. 12, component elements that are the same as those in FIG. 1 are given the same descriptive symbols and a description thereof is omitted.

In the semiconductor device according to the present embodiment, the basic structure is the same as that of the first embodiment shown in FIG. 1, however, the semiconductor chip 100 according to the present embodiment has an electrode body 37 that is formed via the insulating film 22, which is the first insulating film, inside the through hole H4 that is formed extending from the active surface 10a of the semiconductor substrate 10 to the rear surface 10b of the semiconductor substrate 10. The semiconductor chip 100 also has an electrode distal end portion 38 that is formed at a distal end portion of the electrode 34, which is the rear surface 10b of the semiconductor substrate 10. The electrode distal end portion 38 is formed from an electroconductive material that is less readily oxidized than the constituent material of the electrode body 37.

Namely, the electrode 34 is formed on an inner side of the base film 24, however, this electrode 34 is composed of the electrode body 37 and the electrode distal end portion 38. In this case, the electrode body 37 as the same structure as the electrode 34 shown in the first embodiment.

The electrode distal end portion 38 is formed at the distal end portion of the plug portion 36 of the electrode body 37 on the rear side of the substrate 10. This electrode distal end portion 38 is formed from an electroconductive material that is less readily oxidized than the constituent material used to form the electrode body 37, and may be formed, for example, from a metal having a low ionization tendency. Specifically, the electrode distal end portion 38 may be formed from Au, Ag, Pt (platinum), Pd (palladium) or the like. The electrode distal end portion 38 is formed so as to cover the entire distal end surface of the plug portion 36. As a result, it is possible to prevent the distal end surface of the plug portion 36 from becoming oxidized. It is also possible for the electrode distal end portion to be formed so as to cover a portion of the distal end surface of the plug portion. In this case as well, because it is possible to prevent oxidization of the plug portion in the portion where the electrode distal end portion is formed, the electrodes can be bonded together when the semiconductor chips are being stacked. Accordingly, conduction failures between electrodes can be prevented.

If the constituent material of the electrode distal end portion 38 is Pt or Pd, then when the semiconductor chips 2 are stacked, it is difficult for an alloy to be formed between the electrode distal end portion 38 and the solder layer 40. Therefore, it is necessary for the electrode distal end portion 38 to be made thin. In this case as well, it is possible to prevent oxidization of the plug portion 36 of the electrode body 37. Moreover, the constituent material of the electrode distal end portion 38 is able to spread into the solder layer 40 when the semiconductor chips 2 are stacked, and an alloy can be formed between the electrode body 37 and the solder layer 40. In contrast to this, if the constituent material of the electrode distal end portion 38 is Au or Ag, it is easy for an alloy to be formed between the electrode distal end portion 38 and the solder layer 40 during the stacking of the semiconductor chips 2. Therefore the electrode distal end portion 38 can be formed with an optional thickness.

Note that, in the present embodiment, the distal end surface of the above described electrode distal end portion 38 is formed protruding from the surface of the insulating film 26. The height to which the electrode distal end portion 38 protrudes may be set, for example to approximately 10 μm to 20 μm. As a result of this, because it is possible to secure a spacing between semiconductor chips when a plurality of semiconductor chips are being stacked, it is easy for gaps between respective semiconductor chips to be filled with underfill or the like. Note that, it is possible to adjust intervals between stacked semiconductor chips by adjusting the height to which the electrode distal end portion 38 protrudes. Moreover, instead of filling the gaps with underfill after the stacking, even when a thermosetting resin or the like is coated on the rear surface 10b of a semiconductor chip 2 before it is stacked, because it is possible to coat the thermosetting resin or the like while avoiding the electrode distal end portion 38, the wiring of the semiconductor chip can be reliably connected.

(Manufacturing Method)

Next, a method of manufacturing the semiconductor chip according to the present embodiment will be described using FIGS. 13A to 16B.

FIGS. 13A to 16B are explanatory views showing a method of manufacturing the semiconductor chip according to the present embodiment. In each of the drawings component elements having the same structure as those appearing in FIG. 1 are given the same descriptive symbols.

In the manufacturing method of the present embodiment, the processing as far as forming the electrode distal end portion 38 is the same as the processing shown in FIGS. 2A to 3B of the first embodiment, and it is therefore not described here.

Figure 13A:
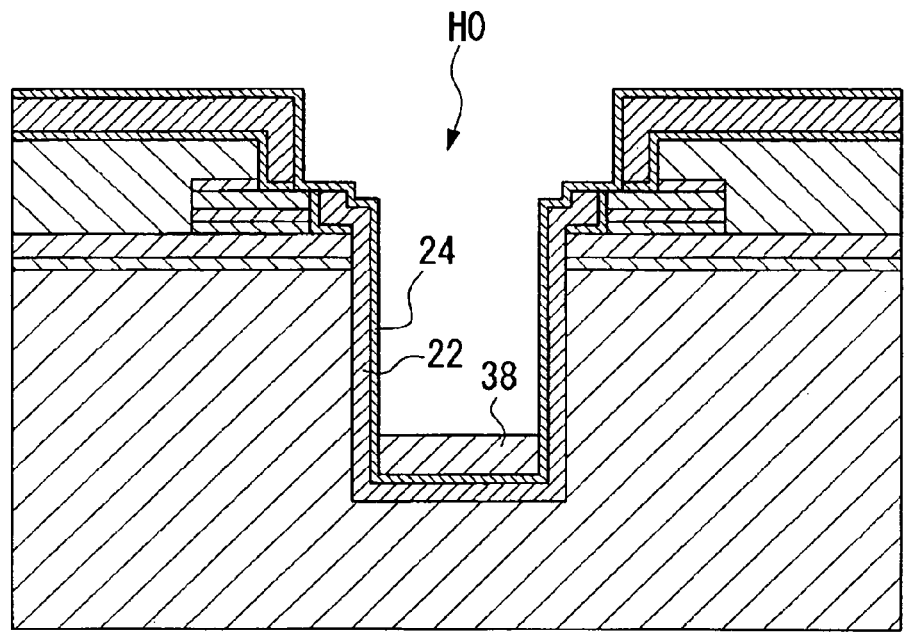
FIGS. 13A and 13B are explanatory views of a method of manufacturing a semiconductor chip according to the third embodiment.

Firstly, as shown in FIG. 3B, on the surface of the exposed electrode pad 16, after the base layer 24 has been formed on the surface of the remaining insulating film 22, then, as shown in FIG. 13A, the electrode distal end portion 38 is formed on a bottom surface of the concave portion H0 on the inner side of the insulating film 22 and the base film 24.

Specifically, this process involves, firstly, discharging a liquid body that contains the constituent material of the electrode distal end portion 38 onto the bottom surface of the concave portion H0 using an ink jet apparatus, which is a droplet discharge apparatus. The liquid body is a colloidal substance obtained by dispersing fine particles of Au or Ag or the like, which are the constituent material of the electrode distal end portion 38, in a solvent such as an alcohol solvent or an organic ester solvent. This liquid body is used after having been first adjusted to a viscosity at which it is capable of being discharged from the ink jet apparatus. The ink jet apparatus is formed such that it is able to discharge a predetermined quantity of droplets from a droplet discharge head. The method used to discharge the droplets may be a piezoelectric method in which a fluid body is discharged by changes in the volume of a piezoelectric element, for a method in which a thermoelectric converter is used as an energy generating element.

Next, the discharged liquid body is dried and baked so as to form the electrode distal end portion 38.

Namely, the electrode distal end portion 38 is formed by drying the liquid body at a high temperature so that the solvent therein is evaporated, and then baking the metal fine particles in the liquid body. In this way, by discharging a liquid body using an inkjet apparatus, it is possible to accurately discharge a predetermined quantity of liquid body onto the bottom surface of the concave portion H0. Accordingly, the electrode distal end portion 38 can be formed with a high degree of precision.

Figure 13B:
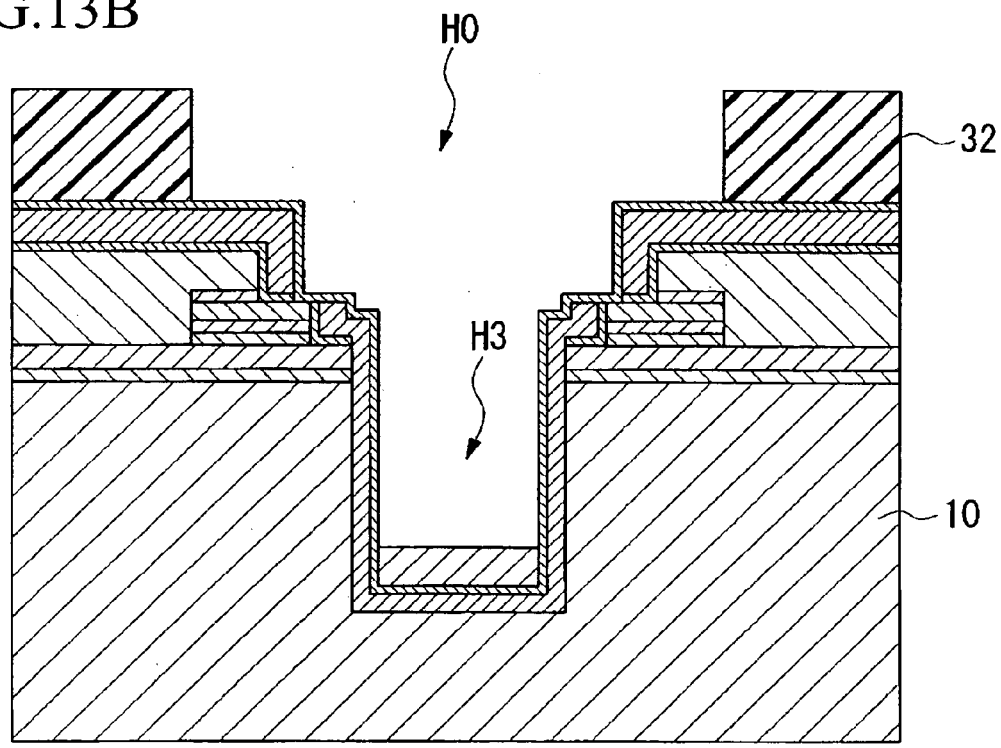

Next, as shown in FIG. 13B, resist 32 is formed on the substrate 10 as a mask for forming an electrode body.

Specifically, this procedure involves, firstly, coating the resist 32 over the entire top surface of the substrate 10. A liquid resist used for plating or a dry film or the like can be employed as the resist 32. Note that it is also possible to use the resist that is used when etching an Al electrode, which is typically provided in a semiconductor device, or a resin resist having insulating properties, however, these must be able to withstand the plating solution and etching solution that are used in the processes described below.

The coating of the resist 32 is performed using a spin coating method, a dipping method, or a spray coating method. Here, the thickness of the resist 32 is set to approximately the same size as the height of the post portion 35 of the electrode 34 that is being formed with the thickness of the solder layer 40 added thereto. Prebaking is performed after the coating of the resist 32.

Next, the planar configuration of the post portion of the electrode being formed is patterned on the resist 32.

Specifically, the resist 32 is patterned by performing exposure processing and developing processing using a mask on which a predetermined pattern has been formed. Here, if the planar configuration of the post portion is rectangular, a rectangular aperture portion is patterned on the resist 32. The size of the aperture portion is set in accordance with the pitch of the electrodes on the semiconductor chip and the like, and the aperture portion may be formed, for example, with 120 µm sides or 80 µm sides. Note that the size of the aperture portion is set such that the resist 32 does not collapse after patterning.

The above is a description of a method of forming the resist 32 such that it surrounds the post portion of the electrode body. However, it is, of course, not absolutely necessary to form the resist 32 such that it surrounds the entire circumference of the post portion. For example, if the electrodes are formed adjacent to each other only in a left-right direction as viewed in FIG. 13B, then it is not necessary to form the resist 32 in the depth direction (when viewed three dimensionally) of FIG. 13B. In this way, the resist 32 is formed along at least a portion of the exterior configuration of the post portion.

Note that the above is a description of a method of forming the resist 32 using photolithographic technology. However, if the resist 32 is formed using this method, then when the resist is coated over the entire surface, a portion thereof enters into the hole portion H3 and there is a concern that this portion will remain as residue inside the hole portion H3 even if developing processing is performed. Therefore, it is preferable that the resist 32 is formed in a patterned state, for example, by using a dry film, or by using a printing method such as screen printing or the like. It is also possible to form the resist 32 in a patterned state by using a droplet discharge apparatus such as an inkjet apparatus or the like to discharge droplets of resist only on positions where the resist 32 is to be formed. If this method is employed, the resist 32 can be formed without resist entering into the hole portion H3.

Figure 14A:
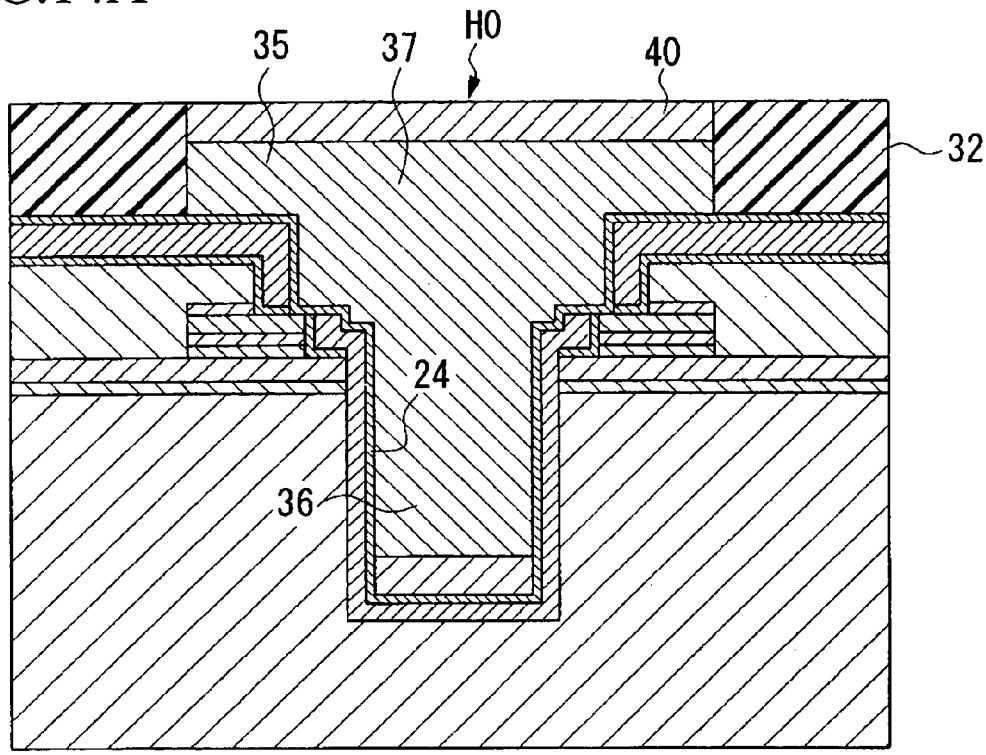
FIGS. 14A and 14B are explanatory views of a method of manufacturing a semiconductor chip according to the third embodiment.

Next, as shown in FIG. 14A, the concave portion H0 is filled with the constituent material of the electrode body 37 using the resist 32 as a mask, so as to form the electrode body 37. This filling of the electrode material is performed by plating processing or by a CVD method or the like. In the plating processing, for example, an electrochemical plating (ECP) method is employed. Note that the seed layer forming the base film 24 is used as the electrode in the plating processing, and a cup type of plating apparatus is used as the plating apparatus. A cup type of plating apparatus has the characteristic that it forms a plating by discharging a plating solution from a cup shaped container. As a result of this, the interior of the concave portion HO is filled with electrode material, so that the plug portion 36 of the electrode body 37 is formed. The aperture portion formed in the resist 32 is also filled with electrode material, so that the post portion 35 of the electrode body 37 is formed.

Figure 14B:
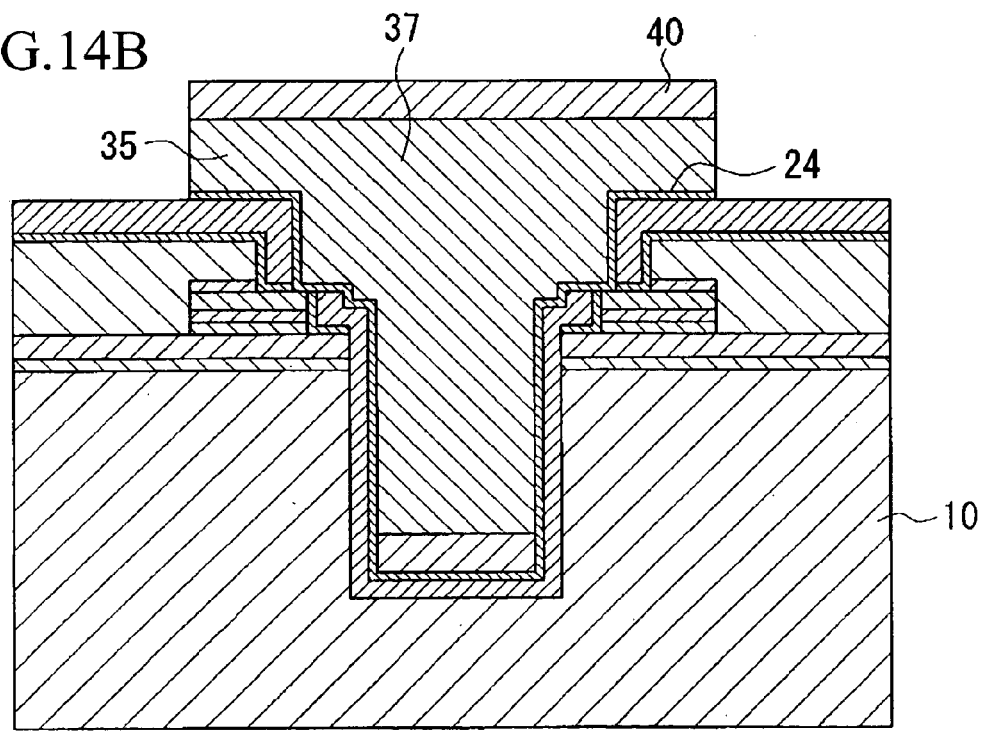

Next, a solder layer 40 is formed on a top surface of the post portion 35 of the electrode body 37. The formation of the solder layer 40 is performed by a solder plating method or a printing method such as a screen printing method or the like. Note that the seed layer forming the base film 24 can be used as the electrode for the solder plating, and a cup type of plating apparatus can be used as the plating apparatus. Instead of the solder layer 40, it is also possible to form a hard solder material layer from SnAg or the like. A hard solder material layer can also be formed using a plating method or printing method. As a result of the above, the state shown in FIG. 14A is obtained Next, as shown in FIG. 14B, the resist 32 is peeled off (i.e., removed) using a peeling solution or the like. Ozone water or the like can be used for the peeling solution. Next, the base film 24 that is exposed on the top of the substrate 10 is removed.

Specifically, this procedure involves, firstly, coating resist or the like over the entire upper surface of the substrate 10, so as to pattern the configuration of the post portion 35 of the electrode 37. Next, the base film 24 is dry etched using the patterned resist as a mask. Note that, if a hard solder material layer is formed instead of the solder layer 40, then the base film 24 can be etched using the hard solder material layer as a mask. In this case, as no photolithography is needed, the manufacturing steps can be simplified.

Figure 15A:
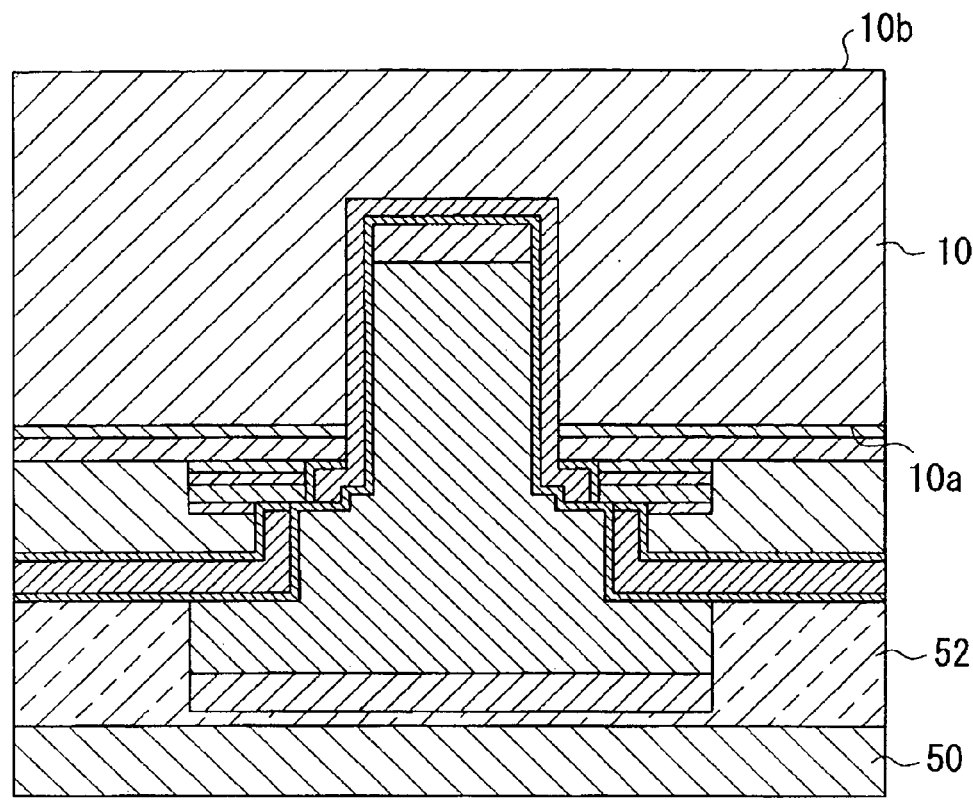
FIGS. 15A and 15B are explanatory views of a method of manufacturing a semiconductor chip according to the third embodiment.

Next, as shown in FIG. 15A, the substrate 10 is vertically inverted and a reinforcing member 50 is attached to the top of the substrate 10. A protective film or the like may be used as the reinforcing member 50, however, it is preferable that a hard material such as glass is used. By employing this structure, it is possible to prevent cracks and the like from occurring in the substrate 10 when the rear surface 10b of the substrate 10 is being processed. The reinforcing member 50 is adhered to the substrate 10 via an adhesive agent 52 or the like. It is desirable that a hardening adhesive agent such as a thermosetting adhesive agent or a photocurable adhesive agent is used as the adhesive agent 52. As a result of this, the reinforcing member 50 can be firmly adhered to the substrate 10 while bumps and indentations in the active surface 10a of the substrate 10 are absorbed. Furthermore, if a photocurable adhesive agent such as an ultraviolet thermosetting adhesive agent is used as the adhesive agent 52, then it is preferable that a transparent material such as glass is employed as the reinforcing member 50. In this case, by irradiating light from the exterior of the reinforcing member 50, the adhesive agent 52 can be easily hardened.

Figure 15B:
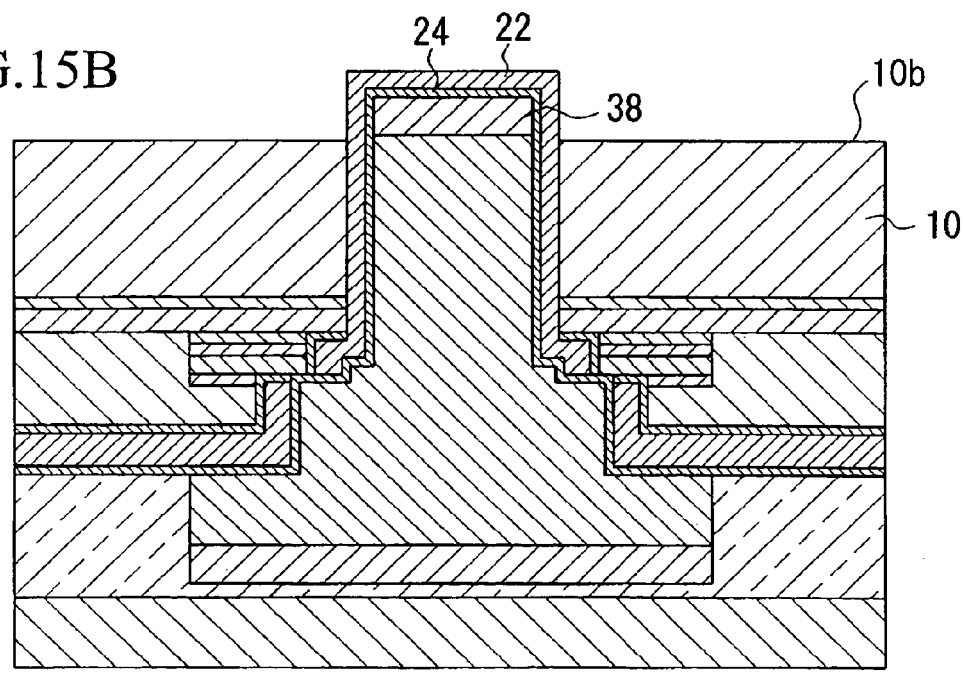

Next, as shown in FIG. 15B, the entire rear surface 10b of the substrate 10 is etched so that the distal end portion of the insulating film 22 is exposed, and the distal end surface of the electrode distal end portion 38 is positioned further to the outside than the rear surface 10b of the substrate 10. Either wet etching or dry etching may be used for this etching. If etching is performed to expose the distal end portion of the insulating film 22 after the rear surface 10b of the substrate 10 has been roughly ground, then it is possible to shorten the manufacturing time. It is also possible to remove the insulating film 22 and the base film 24 by etching at the same time as the etching of the substrate 10 is being performed.

Figure 16A:
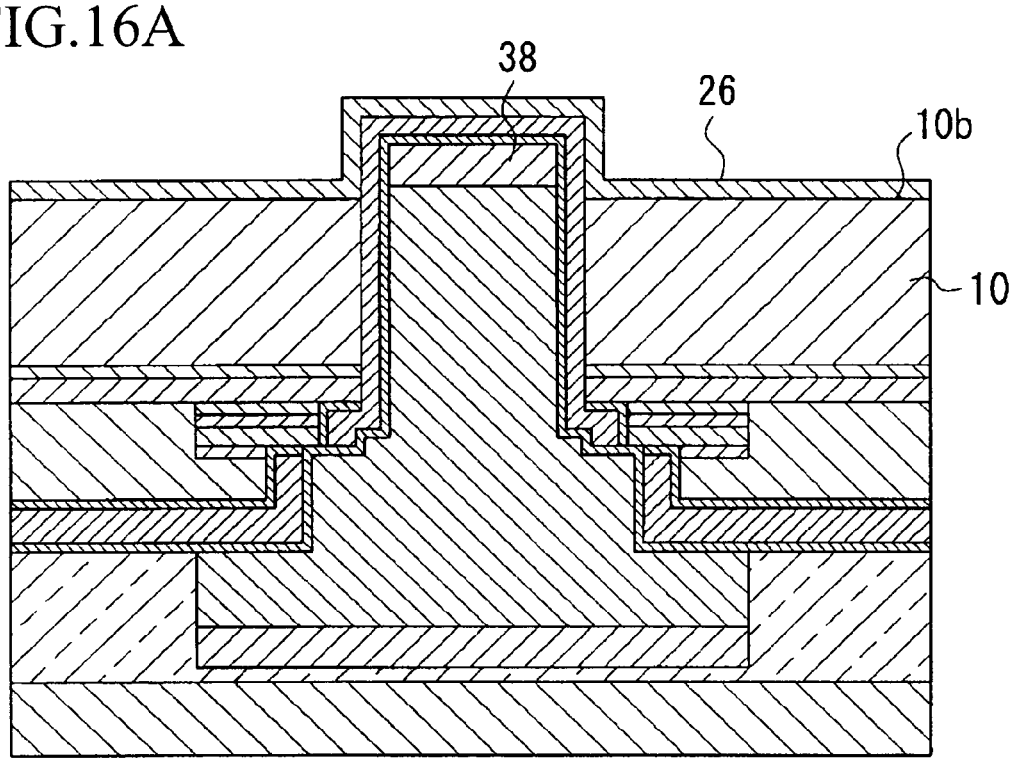
FIGS. 16A and 16B are explanatory views of a method of manufacturing a semiconductor chip according to the third embodiment.

Next, as shown in FIG. 16A, the insulating film 26, which is a second insulating layer, is formed over the entire rear surface 10b of the substrate 10. If a coating such as $SiO_2$ or SiN is formed as the insulating film 26, then it is preferable that the insulating film 26 is formed by a CVD method. If a coating such as PI is formed as the insulating film 26, then it is preferable that the insulating film 26 is formed by coating a liquid coating material using a spin coating method, and then drying and baking this material. It is also possible to form the insulating film 26 using SOG. SOG is a liquid that, after being coated, becomes $SiO_2$ by being baked at a temperature of approximately 400° C., and is used in LSI interlayer insulating films in order to flatten the surface. Specifically, SOG is a polymer having a siloxane bond for its fundamental structure, and is used with alcohol or the like as a solvent. When this SOG is coated, a spin coating method is used.

Note that, instead of forming the insulating film 26 over the entire rear surface 10b of the substrate 10, it is also possible to form the insulating film 26 selectively in only the periphery of the electrode distal end portion 38 on the rear surface 10b of the substrate 10. In this case, liquid material of the insulating film is discharged only at the periphery of the electrode distal end portion 38 using an inkjet apparatus or the like. This liquid material is then dried and baked to form the insulating film 26.

Figure 16B:
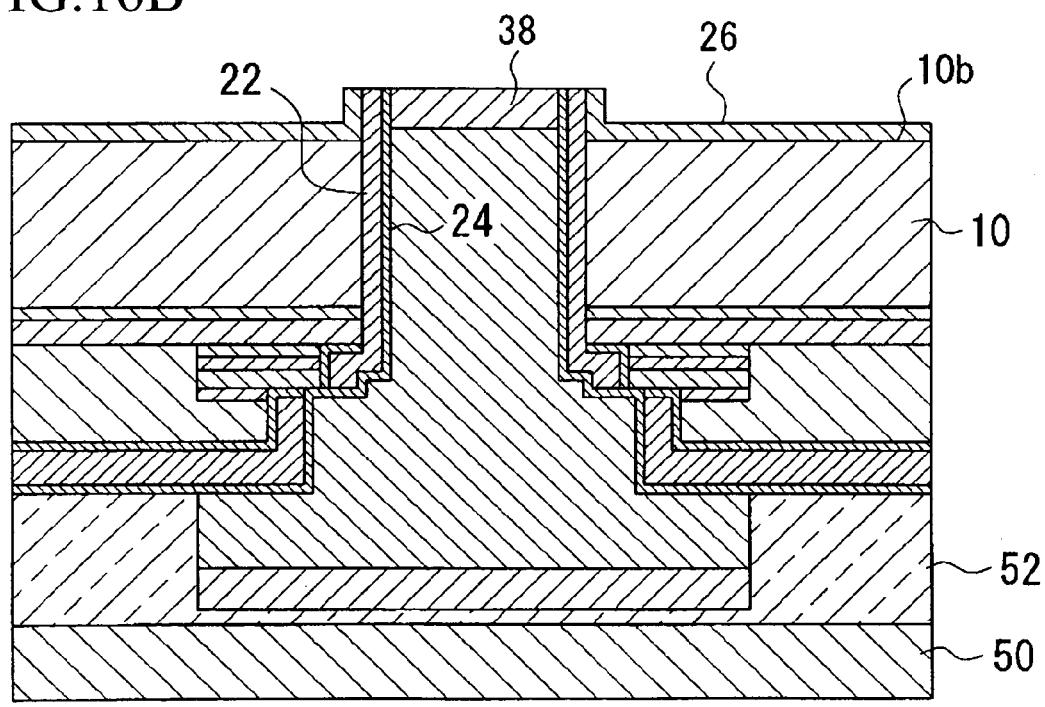

Next, as shown in FIG. 16B, the distal end surface of the electrode distal end portion 38 is exposed.

Specifically, the distal end surface of the electrode distal end portion 38 is exposed by removing the insulating film 26, the insulating film 22, and the base film 24 that cover the distal end surface of the electrode distal end portion 38. This removal of the insulating film 26, the insulating film 22, and the base film 24 can be performed by chemical and mechanical polishing (CMP). CMP is a method of grinding a substrate in which mechanical grinding of the substrate using an abrasive cloth is combined with the chemical action of the grinding solution that is supplied to the mechanical grinding. Note that the distal end surface of the electrode distal end portion 38 may also be ground when the insulating film 26, the insulating film 22, and the base film 24 are removed by grinding. In this case, because the base film 24 is completely removed, it is possible to prevent conduction failures between electrodes when the semiconductor chips are being stacked.

Next, the adhesive agent 52 is dissolved using a solvent or the like and the reinforcing member 50 is removed from the substrate 10. Next, after dicing tape (not shown) has been adhered to the rear surface 10b of the substrate 10, the substrate 10 is diced. As a result, the semiconductor chips are separated into individual pieces. It is also possible to cut the substrate 10 by irradiating a $CO_2$ laser or a YAG laser onto the substrate 10. As a result of the above, the state shown in FIG. 12 is obtained and the semiconductor chip 100 according to the present embodiment is completed.

(Stacking Structure)

A three dimensionally packaged semiconductor device is formed by stacking semiconductor chips 100 that have been formed in the manner described above.

Figure 17:
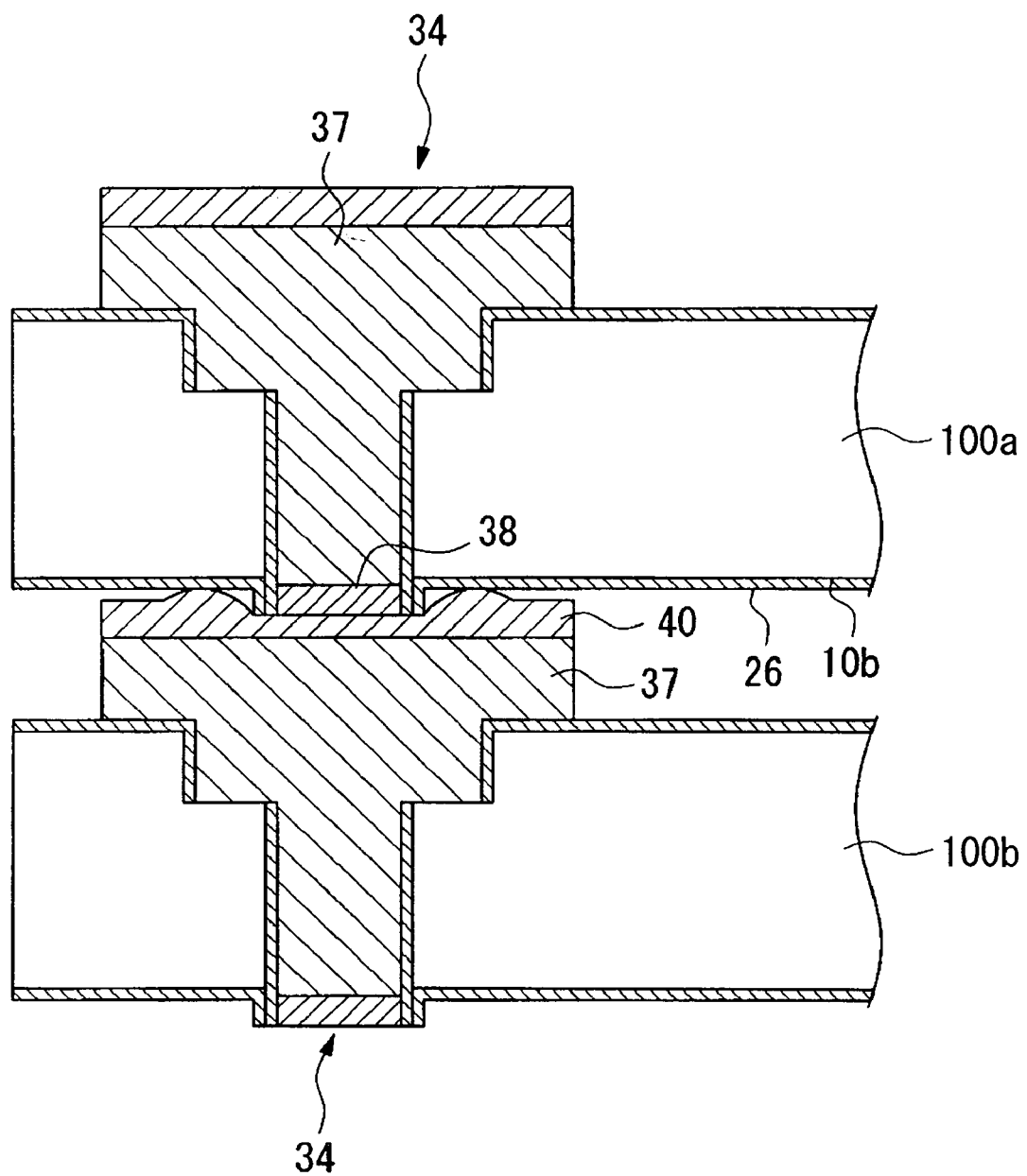
FIG. 17 is an explanatory view showing a state in which semiconductor devices according to the third embodiment are stacked.

FIG. 17 is a side cross-sectional view showing a state in which semiconductor chips according to the present embodiment are stacked and is an enlarged view of portions corresponding to the A portion in FIG. 20. The two semiconductor chips 100a and 100b are placed such that the electrode distal end portion 38 of the upper semiconductor chip 100a is positioned on a top surface of the electrode body 37 of the lower semiconductor chip 100b. The electrodes 34 in each semiconductor chip 100a and 100b are bonded together by inserting the solder layer 40. Specifically, the semiconductor chips 100a and 100b are compressed together while the solder layer 40 is melted by reflow. As a result, a solder alloy is formed in the bond portion between the solder layer 40 and the electrode distal end portion 38, and the two are bonded mechanically and electrically. Consequently a wiring connection is achieved between the semiconductor chips 100a and 100b. Note that, if necessary, gaps between each stacked semiconductor chip can be filled with underfill.

Note that, because the melted solder layer 40 is deformed upwards along the outer circumference of the electrode distal end portion 38 of the upper semiconductor chip 100a, in some cases, the melted solder layer 40 comes into contact with the rear surface 10b of the upper semiconductor chip 100a. Because signal wiring is connected to the solder layer 40, and because a ground is connected to the rear surface 10b of the semiconductor chip 100a, it is necessary to prevent the two from short-circuiting. In the present embodiment, because the insulating film 26 is formed on the rear surface 10b of the semiconductor chip 100a, when stacking the semiconductor chips, it is possible to prevent the solder layer 40 short-circuiting with the rear surface 10b of the semiconductor chip 100a. Accordingly, three-dimensional packaging can be performed while short-circuiting between the signal wiring and the ground is prevented.

Moreover, in the present embodiment, the electrode distal end portion 38, which is formed from an electroconductive material that is less readily oxidized than the constituent material of the electrode body 37, is formed at a distal end portion of the electrode body 37 on the rear side of the semiconductor chip 100a. As a result, it is possible to prevent the electrodes 34 of the semiconductor chip 100a from becoming oxidized and the wettability thereof consequently deteriorating. Accordingly, even if the semiconductor chips 100a are stacked after a lengthy period time has passed since the formation of the semiconductor chips 2a, a solder alloy is formed between the solder layer 40 and the electrode distal end portion 38, and it is possible to bond the electrodes 34 together and avoid conduction failures between electrodes 34. As a result, it is possible to improve the yield of three dimensionally packaged semiconductor devices.

The third embodiment of the present invention has been described above, however, it is to be understood that the semiconductor device of the present embodiment can also be applied to the relocated wiring and circuit substrate shown in the first embodiment.

Fourth Embodiment

Next, the semiconductor chip according to the fourth embodiment of the semiconductor device of the present invention will be described using FIG. 18.

Figure 18:
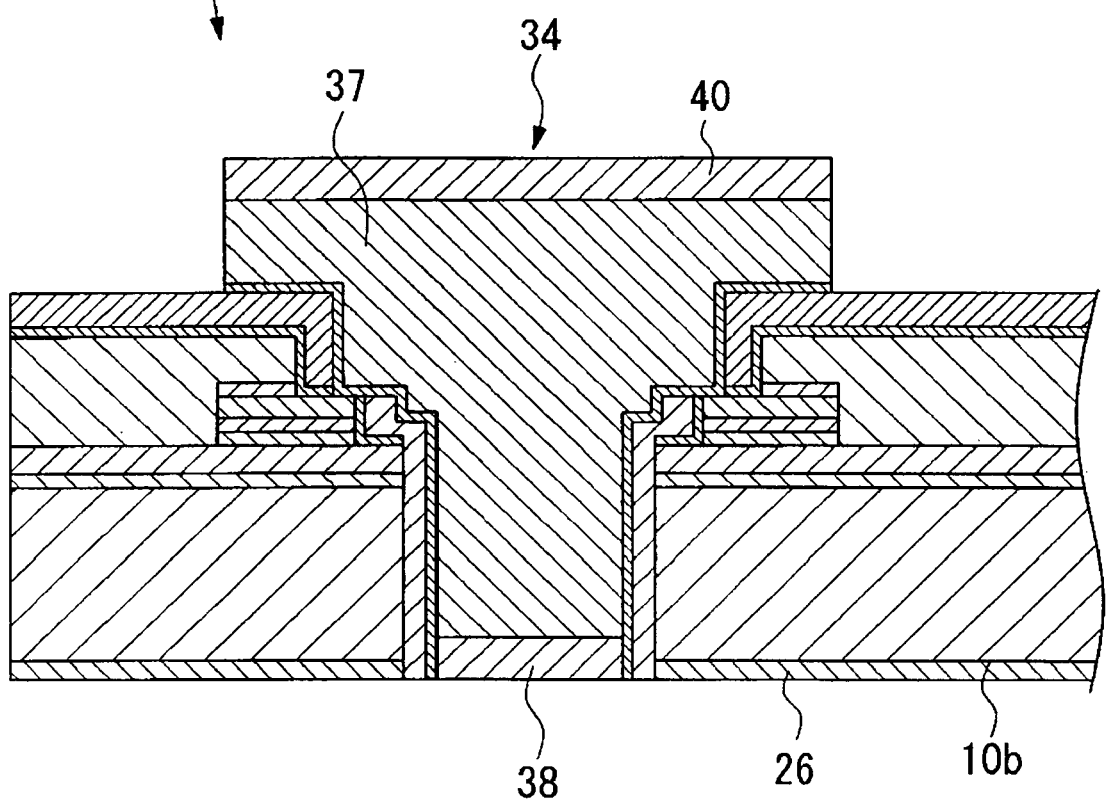
FIG. 18 is a side cross-sectional view of electrode portions of a semiconductor chip according to the fourth embodiment.
Figure 21:
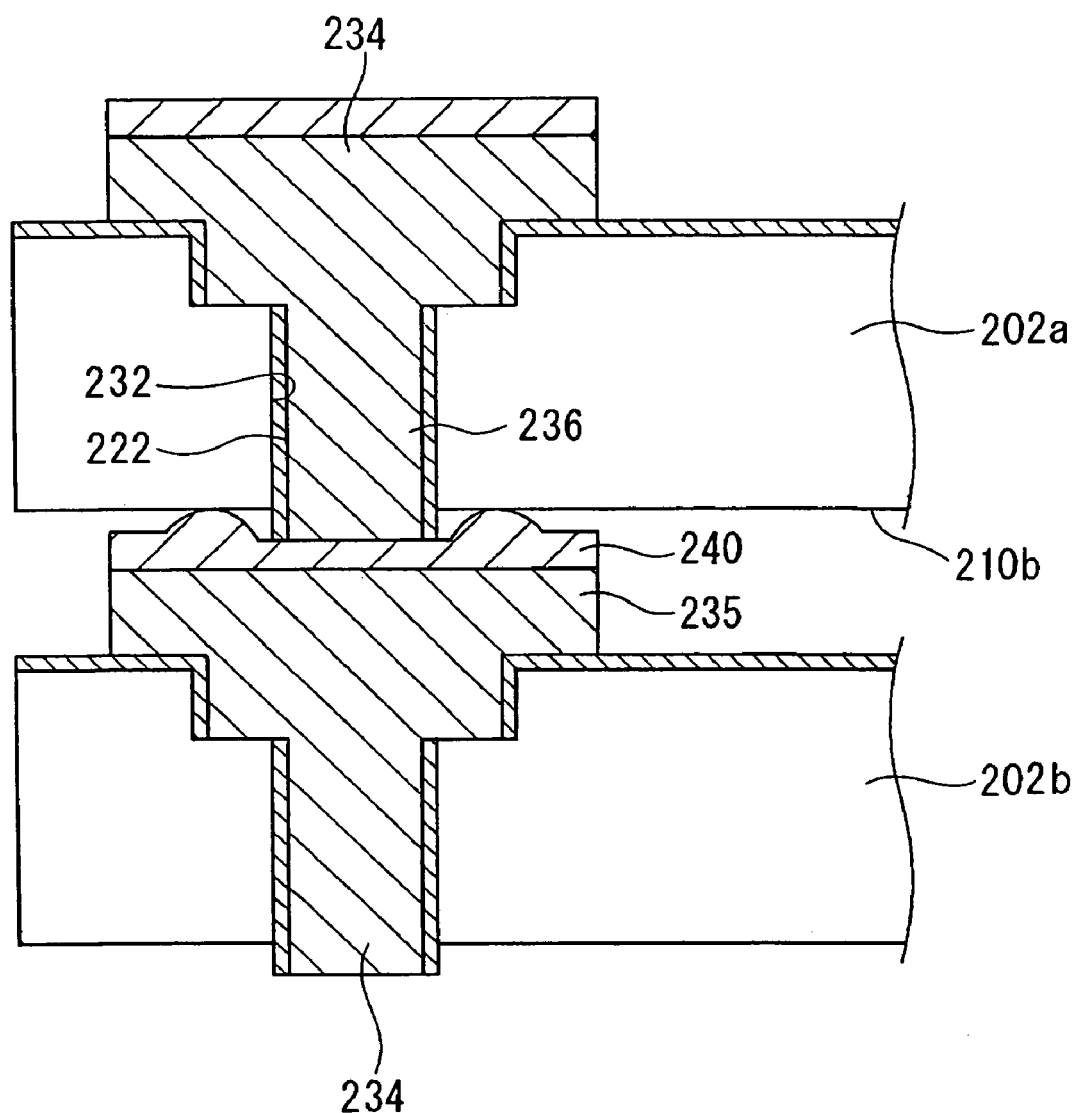
FIG. 21 is an explanatory view showing a state in which semiconductor devices according to the conventional technology are stacked.

FIG. 18 is a side cross-sectional view of electrode portions of the semiconductor chip according to the present embodiment.

The semiconductor chip 101 according to the present embodiment differs from that of the third embodiment, in particular, only in that the distal end surface of the electrode distal end portion 38a on the rear side of the semiconductor chip 101 is formed on substantially the same plane as the surface of the insulating film 26, which is the second layer. The remainder of the structure is the same as that of the third embodiment and a detailed description thereof is omitted here.

In the semiconductor chip 101 of the second embodiment, the bottom end surface of the electrode distal end portion 38a is formed on substantially the same plane as the surface of the insulating film 26 formed on the rear surface 10b of the semiconductor chip 101. When manufacturing the semiconductor chip 101 according to the fourth embodiment, the hole portion H3 shown in FIG. 2C is formed shallower than the hole portion H3 of the third embodiment. As a result, when etching the rear surface 10b of the substrate 10 shown in FIG. 15B, the height of the protrusion of the insulating film 22 is less than in the third embodiment. Furthermore, when forming the insulating film 26 on the rear surface 10b of the substrate 10 shown in FIG. 16A, the insulating film 26 is formed thicker than in the third embodiment. Moreover, when exposing the distal end surface of the electrode distal end portion 38 shown in FIG. 16B by grinding, the distal end surface of the electrode distal end portion 38 is exposed while the surface of the insulating film 26 is being ground. Consequently, as shown in FIG. 18, the bottom end surface of the electrode distal end portion 38a is exposed on substantially the same plane as the surface of the insulating film 26 that is formed on the rear surface 10b of the semiconductor chip 101.

In the semiconductor chip according to the fourth embodiment, in the same way as in the third embodiment, the electrode distal end portion 38, which is formed from an electroconductive material that is less readily oxidized than the constituent material used to form the electrode body 37, is formed at a distal end portion of the electrode body 37 on the rear side of the semiconductor chip 101. Accordingly, it is possible to prevent the electrode 34 of the semiconductor chip 101 from becoming oxidized. Furthermore, because the insulating film 26 is formed on the rear surface 10b of the semiconductor chip 101, as shown in FIG. 17, when stacking the respective semiconductor chips it is possible to prevent the solder layer 40 from short-circuiting with the rear surface 10b of the upper semiconductor chip.

In the third embodiment, the distal end surface of the electrode distal end portion 38 is formed so as to protrude from the surface of the insulating film 26. When the semiconductor chips are being stacked, because only the electrode distal end portions 38 of the upper semiconductor chip are in contact with the lower semiconductor chip when the semiconductor chips are compressed together, there are cases in which concentrations of stress are generated in the lower semiconductor chip. As a result, there is the possibility that the lower semiconductor chip will crack or break. In contrast, in the fourth embodiment, the distal end surface of the electrode distal end portion 38a is formed on substantially the same plane as the surface of the insulating film 26. As a result, no concentrations of stress are generated in the lower semiconductor chip when the semiconductor chips are compressed together during the stacking thereof, and it is possible to perform three-dimensional packaging while preventing the lower semiconductor chip from breaking. Note that the fact that it is possible to prevent short-circuiting between the signal wiring and the ground without forming the distal end surface of the electrode distal end portion 38 such that it protrudes, as in the third embodiment, is in accordance with the above description.

(Electronic Apparatus)

Next, an example of an electronic apparatus provided with the above described semiconductor device will be described using FIG. 19.

FIG. 19 is a perspective view of a mobile telephone.

The above described semiconductor device is located within a housing of a mobile telephone 300.

Note that the above described semiconductor device may be applied to a variety of electronic apparatuses in addition to a mobile telephone. For example, the semiconductor device may be applied to electronic apparatuses such as liquid crystal projectors, personal computers (PC) and engineering work stations (EWS) for dealing with multimedia, pagers, word processors, televisions, viewfinder type or direct view monitor type of video tape recorders, electronic diaries, electronic desktop calculators, car navigation systems, POS terminals, and devices provided with touch panels.

Note also that it is also possible to manufacture electronic apparatuses by replacing the "semiconductor chip" of the above described embodiment with an "electronic device". Examples of electronic apparatuses manufactured using such electronic devices include optical devices, resistors, condensers, coils, oscillators, filters, temperature sensors, thermistors, varistors, capacitors, and fuses.

It is to be understood that the technological range of the present invention is not limited to the above embodiments and other design modifications may be included as long as they do not depart from the spirit or scope of the present invention. Specific materials and layer structures and the like described in the above embodiments are merely examples and may be modified as is considered appropriate.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of manufacturing a semiconductor device having electrodes penetrating a semiconductor substrate, the method comprising the steps of:
    forming a concave portion extending from an active surface of a semiconductor substrate on which an integrated circuit is formed to an interior of the semiconductor substrate;
    forming a first insulating layer on an inner surface of the concave portion;
    filling an inner side of the first insulating layer with an electroconductive material so as to form an electrode;
    exposing a distal end portion of the first insulating layer by etching a rear surface of the semiconductor substrate;
    forming a second insulating layer on the rear surface of the substrate; and
    exposing the distal end portion of the electrode by removing the first insulating layer and the second insulating layer from a distal end portion of the electrode,
    wherein a cross-sectional area of the distal end portion is made equal to or smaller than a cross-sectional area of the electrode at the active surface of the substrate.

2. A method of manufacturing a semiconductor device according to claim 1, further comprising a step of attaching, before the rear surface of the semiconductor substrate is etched, a reinforcing member that reinforces the semiconductor substrate to the active surface of the semiconductor substrate via a hardening adhesive agent.

3. A method of manufacturing a semiconductor device according to claim 1, further comprising the steps of:
    forming, before the electrode is formed, a barrier layer that prevents the electroconductive material from spreading to the semiconductor substrate on an interior side of the first insulating layer; and
    exposing the distal end portion of the electrode by removing the barrier layer at the distal end portion of the electrode at the same time as removing the first insulating layer and the second insulating layer at the distal end portion of the electrode.

4. A method of manufacturing a semiconductor device according to claim 1, wherein, in the step of forming the second insulating layer, a coating of silicon oxide or silicon nitride that constitutes the second insulating layer is formed using a CVD method.

5. A method of manufacturing a semiconductor device according to claim 1, wherein, in the step of forming the second insulating layer, a liquid SOG or polyimide that is a base material of the second insulating layer is coated using a spin coating method.

6. A method of manufacturing a semiconductor device according to claim 1, wherein the step for forming the electrode further comprising the steps of:
    forming an electrode distal end portion formed from a first electroconductive material on a bottom surface of the concave portion on an inner side of the first insulating layer; and
    forming an electrode body that is formed from a second electroconductive material and is connected to the electrode distal end portion on an inner side of the first insulating layer, and
    wherein, in the step of exposing the electrode, the electrode distal end portion is exposed by removing the first insulating layer that is formed on top of a distal end surface of the electrode distal end portion, and
    wherein the first electroconductive material is less readily oxidized than the second electroconductive material.

7. A method of manufacturing a semiconductor device according to claim 6, wherein, in the step of forming the electrode distal end portion, a liquid body containing the first electroconductive material is discharged using a droplet discharge apparatus onto the bottom surface of the concave portion on an inner side of the first insulating layer, and the discharged liquid body is then baked.

8. A method of manufacturing a semiconductor device according to claim 1, further comprising the step of forming an electrode pad before the step of forming the concave portion.

9. A method of manufacturing a semiconductor device according to claim 1, wherein the electrode has a stepped cross-section.

* * * * *